United States Patent
Hong et al.

(10) Patent No.: US 11,972,941 B2
(45) Date of Patent: Apr. 30, 2024

(54) PRECURSOR SOLUTION FOR THIN FILM DEPOSITION AND THIN FILM FORMING METHOD USING SAME

(71) Applicant: SK TRICHEM, Sejong (KR)

(72) Inventors: Chang Sung Hong, Sejong (KR); Yong Joo Park, Daejeon (KR); Tae Hoon Oh, Sejong (KR); In Chun Hwang, Gimpo-si (KR); Sang Kyung Lee, Sejong (KR); Dong Hyun Kim, Sejong (KR)

(73) Assignee: SK TRICHEM, Sejong (KR)

( * ) Notice: Subject to any disclaimer, the term of this patent is extended or adjusted under 35 U.S.C. 154(b) by 547 days.

(21) Appl. No.: 17/288,604

(22) PCT Filed: Dec. 6, 2019

(86) PCT No.: PCT/KR2019/017151
§ 371 (c)(1),
(2) Date: Apr. 26, 2021

(87) PCT Pub. No.: WO2020/122506
PCT Pub. Date: Jun. 18, 2020

(65) Prior Publication Data
US 2021/0327708 A1    Oct. 21, 2021

(30) Foreign Application Priority Data

Dec. 12, 2018 (KR) .......... 10-2018-0159668
Dec. 4, 2019 (KR) .......... 10-2019-0160118

(51) Int. Cl.
*H01L 29/02* (2006.01)
*C07F 7/00* (2006.01)
*C07F 17/00* (2006.01)
*C23C 16/18* (2006.01)
*C23C 16/455* (2006.01)
*H01L 21/02* (2006.01)
*H01L 21/28* (2006.01)
*H01L 29/51* (2006.01)

(52) U.S. Cl.
CPC .......... *H01L 21/02205* (2013.01); *C07F 7/00* (2013.01); *C23C 16/18* (2013.01); *C23C 16/45553* (2013.01); *H01L 21/02181* (2013.01); *H01L 21/02189* (2013.01); *H01L 21/02194* (2013.01); *H01L 21/28194* (2013.01); *H01L 29/517* (2013.01); *C23C 16/45536* (2013.01)

(58) Field of Classification Search
CPC ....... H01L 29/517; H01L 21/02; H01L 21/28; C07F 17/00
See application file for complete search history.

(56) References Cited

FOREIGN PATENT DOCUMENTS

| JP | 2014-510733 A | 5/2014 |
|---|---|---|
| KR | 10-2001-0098415 A | 11/2001 |
| KR | 10-2010-0016477 A | 2/2010 |
| KR | 10-2014-0078534 A | 6/2014 |
| KR | 10-2016-0000392 A | 1/2016 |

*Primary Examiner* — Caixia Lu
(74) *Attorney, Agent, or Firm* — NKL Law; Jae Youn Kim

(57) ABSTRACT

Proposed is a precursor composition for forming a metal film including a zirconium compound represented by any one of Chemical Formulas 1 to 3 and a hafnium compound represented by any one of Chemical Formulas 4 to 6.

24 Claims, 12 Drawing Sheets

| Upper electrode |
|---|
| $Zr_xHf_yO_z$ |
| $Al_xO_y$ |
| $Zr_xHf_yO_z$ |
| Lower electrode |

FIG. 1A

| Upper electrode |
|---|
| $Zr_xHf_yO_z$ |
| $Al_xO_y$ |
| $ZrO_x$ |
| $HfO_x$ |
| Lower electrode |

FIG. 1B

| Upper electrode |
|---|
| $Zr_xHf_yO_z$ |
| $Al_xO_y$ |
| $HfO_x$ |
| $ZrO_x$ |
| Lower electrode |

FIG. 1C

| Upper electrode |
|---|
| $HfO_x$ |
| $ZrO_x$ |
| $Al_xO_y$ |
| $Zr_xHf_yO_z$ |
| Lower electrode |

FIG. 1D

| Upper electrode |
|---|
| $ZrO_x$ |
| $HfO_x$ |
| $Al_xO_y$ |
| $Zr_xHf_yO_z$ |
| Lower electrode |

FIG. 1E

| Upper electrode |
|---|
| $Zr_xHf_yO_z$ |
| $Y_xO_y$ |
| $Zr_xHf_yO_z$ |
| Lower electrode |

FIG. 1F

PRECURSOR SOLUTION FOR THIN FILM DEPOSITION AND THIN FILM FORMING METHOD USING SAME

TECHNICAL FIELD

The present disclosure relates to a precursor composition for forming a metal film, a method of forming a metal film using the same, and a semiconductor device including the metal film, and more particularly to a precursor composition for forming a metal film containing zirconium and hafnium, used in atomic layer deposition (ALD) or chemical vapor deposition (CVD), a method of forming a metal film using the same, and a semiconductor device including the metal film.

BACKGROUND ART

Various types of organometallic compounds have been developed and used as precursors for atomic layer deposition (ALD) or chemical vapor deposition (CVD) processes. Silicon oxide is the material that is mainly used when manufacturing semiconductor devices such as DRAM, capacitors and the like through such a deposition process. However, as high-k electrical properties have recently come to be required, thin films using hafnium or zirconium oxide rather than conventional silicon oxide have been manufactured.

In order to manufacture such a thin film, it is necessary to select and optimize a precursor suitable for the process. For example, Korean Patent Application Publication No. 10-2012-0093165 discloses the use of a hafnium or zirconium compound of Chemical Formula $ML(NR7R8)_3$ as a precursor. Here, the precursor is a compound containing a cyclopentadienyl ligand, which is confirmed to be a material suitable for a thin-film formation process.

In the above patent, a zirconium-containing thin film and a hafnium-containing thin film are manufactured by applying a zirconium compound and a hafnium compound, respectively, but the manufacture of a zirconium-hafnium-containing thin film using the zirconium compound and the hafnium compound in combination is not disclosed.

In addition, U.S. Pat. No. 8,962,078 discloses a hafnium cyclopentadienyl compound as a hafnium precursor and a zirconium cyclopentadienyl compound as a zirconium precursor, but does not mention the manufacture of a zirconium-hafnium-containing thin film using the zirconium compound and the hafnium compound in combination.

In addition, Korean Patent Application Publication No. 10-2017-0016748 discloses a method of forming a material film using a first source material and a second source material, which are different from each other, in which the source materials that are described are $CpZr(NMe_2)_3$, $Hf(O-t-Bu)_4$, $Hf(NEt_2)_4$, $Hf(NEtMe)_4$, $Hf(NMe_2)_4$, TDMAH, etc. Although there is an indication that the zirconium compound and the hafnium compound are used in combination, the manufacture of a zirconium-hafnium-containing thin film is not specifically disclosed.

DISCLOSURE

Technical Problem

The present disclosure has been made keeping in mind the problems encountered in the related art, and an objective of the present disclosure is to provide a precursor composition containing a zirconium compound and a hafnium compound for manufacturing a zirconium-hafnium-containing thin film exhibiting high-k properties.

Another objective of the present disclosure is to provide a precursor composition for manufacturing a zirconium-hafnium-containing thin film capable of being transferred into a chamber through vaporization by including a solvent capable of diluting or dissolving at least one of the above compounds.

Technical Solution

In order to accomplish the above objectives, the present disclosure provides a precursor composition for forming a metal film, including a zirconium compound represented by any one of Chemical Formula 1 to Chemical Formula 3 below and a hafnium compound represented by any one of Chemical Formula 4 to Chemical Formula 6 below.

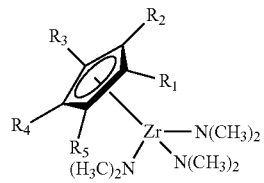

[Chemical Formula 1]

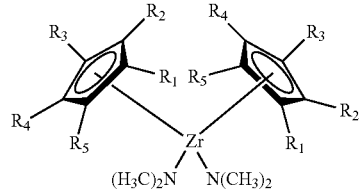

[Chemical Formula 2]

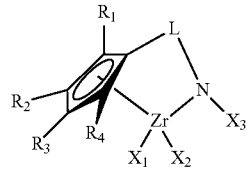

[Chemical Formula 3]

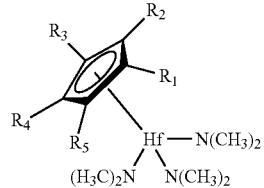

[Chemical Formula 4]

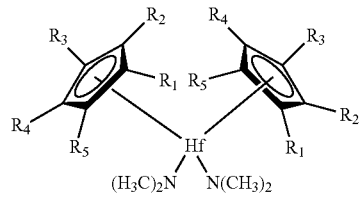

[Chemical Formula 5]

-continued

[Chemical Formula 6]

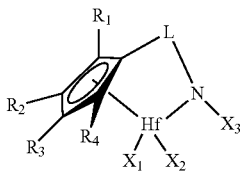

(In Chemical Formulas 1 to 6, $R_1$ to $R_5$ are each independently a hydrogen atom or a $C_1$-$C_6$ alkyl group, L is a linker including Si or $C_1$-$C_3$, and each of $X_1$ to $X_3$ is a $C_1$-$C_5$ alkyl group, —$NR_6R_7$, —$OR_8$, or a cyclopentadienyl group with or without a substituent, in which $R_6$ to $R_8$ are each independently a $C_1$-$C_6$ alkyl group.)

Here, the precursor composition for forming a metal film may further include a solvent, and the solvent may include at least one selected from among a $C_1$-$C_{16}$ saturated or unsaturated hydrocarbon, ketone, ether, glyme, ester, tetrahydrofuran, and tertiary amine.

Also, the amount of the solvent may be 0.1 to 99 wt % based on the total weight of the precursor composition for forming a metal film.

Also, the zirconium compound and the hafnium compound may be mixed at a weight ratio of 0.1:99.9 to 99.9:0.1.

In addition, the present disclosure provides a method of forming a metal film including depositing a metal film on a substrate using the precursor composition described above.

Here, the precursor composition for forming a metal film may further include a solvent, and the solvent may be included in an amount of 0.1 to 99 wt % based on the total weight of the precursor composition for forming a metal film.

Also, the metal film may be deposited through any one process selected from among atomic layer deposition, chemical vapor deposition, and evaporation.

Also, the method of forming the metal film may further include a precursor composition transfer step of supplying the precursor composition for forming a metal film onto the substrate, in which the precursor composition transfer step may be performed through any one process selected from among a volatilization transfer process using vapor pressure, a direct liquid injection process, and a liquid transfer process using a liquid delivery system.

Also, the depositing may include placing a substrate in a chamber, supplying the precursor composition for forming a metal film into the chamber, supplying a reactive gas or a plasma of a reactive gas into the chamber, and performing at least one selected from among heat treatment, plasma treatment and light irradiation in the chamber.

Here, the reactive gas may be at least one selected from among water vapor ($H_2O$), oxygen ($O_2$), ozone ($O_3$), hydrogen peroxide ($H_2O_2$), hydrogen ($H_2$), ammonia ($NH_3$), nitrogen monoxide (NO), nitrous oxide ($N_2O$), nitrogen dioxide ($NO_2$), hydrazine ($N_2H_4$), and silane ($SiH_4$), and the plasma of the reactive gas may be any one selected from among RF plasma, DC plasma, and remote plasma.

Also, the deposition temperature in the chamber may be 250° C. to 400° C.

Also, the zirconium compound and the hafnium compound may be mixed at a weight ratio of 0.1:99.9 to 99.9:0.1.

In addition, the present disclosure provides a semiconductor device including a metal film manufactured using the method described above, and also provides a transistor including a metal film manufactured using the method described above, in which the metal film constitutes a gate-insulating layer of the transistor.

Advantageous Effects

According to the present disclosure, a precursor composition contains a zirconium compound and a hafnium compound and thus shows properties suitable for manufacturing a zirconium-hafnium-containing thin film exhibiting high-k properties.

In addition, the precursor composition includes a solvent capable of diluting or dissolving at least one of the above compounds, making it possible to effectively transfer even a liquid composition having high viscosity or a solid compound into a chamber through vaporization.

In addition, the use of the precursor composition is capable of manufacturing a thin film for various semiconductor devices exhibiting high-k properties.

BRIEF DESCRIPTION OF DRAWINGS

FIGS. 1A-1F are conceptual diagrams showing the cross-section of a capacitor in which a precursor composition for depositing a thin metal film according to the present disclosure is applied to a dielectric thin film;

BEST MODE

Figure 2:
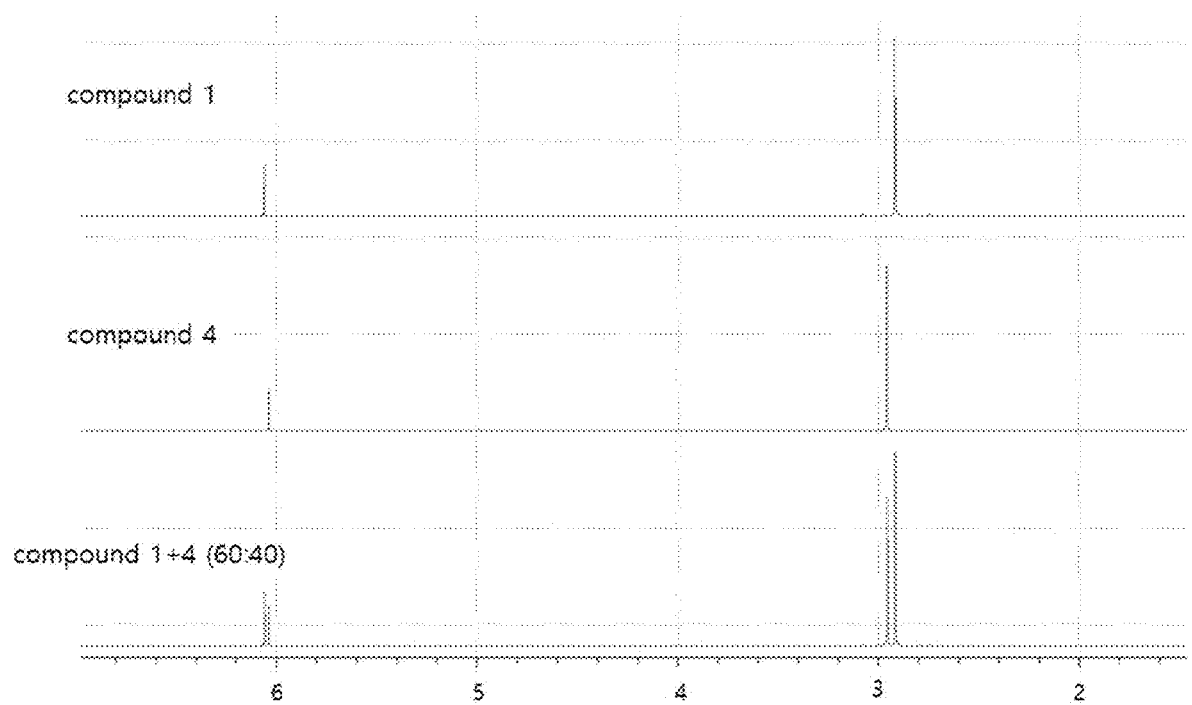
FIG. 2 shows the results of NMR analysis of Compound 1, Compound 4 and a composition including Compounds 1 and 4.
Figure 3:
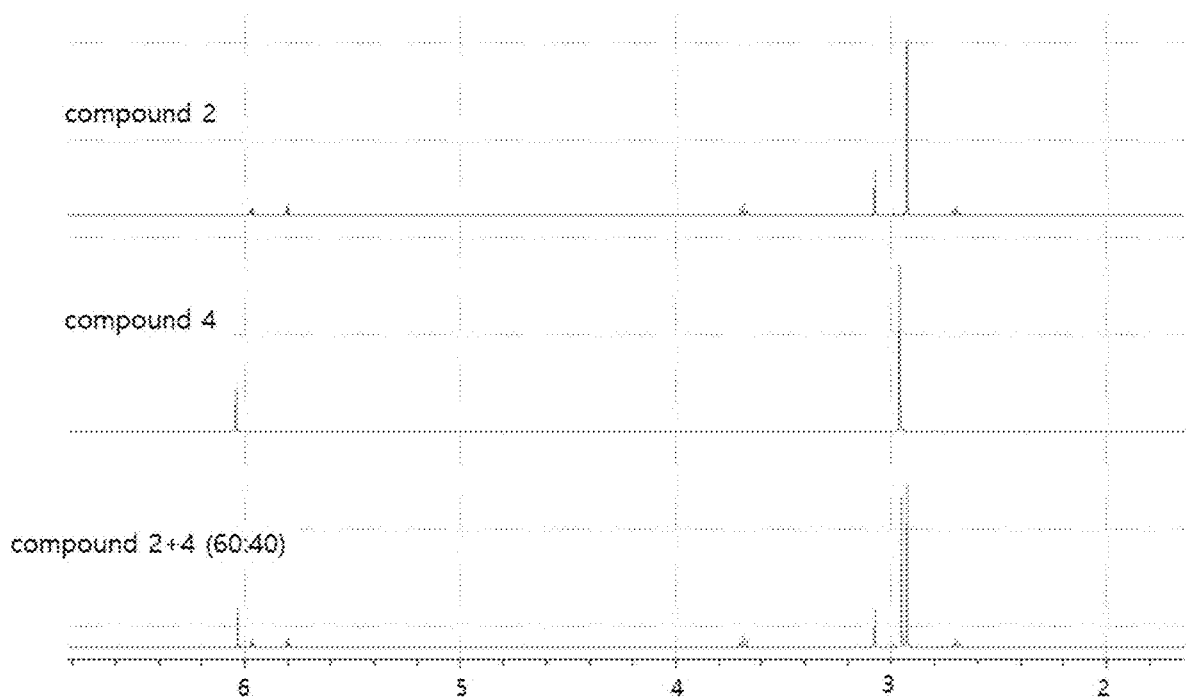
FIG. 3 shows the results of NMR analysis of Compound 2, Compound 4 and a composition including Compounds 2 and 4.
Figure 4:
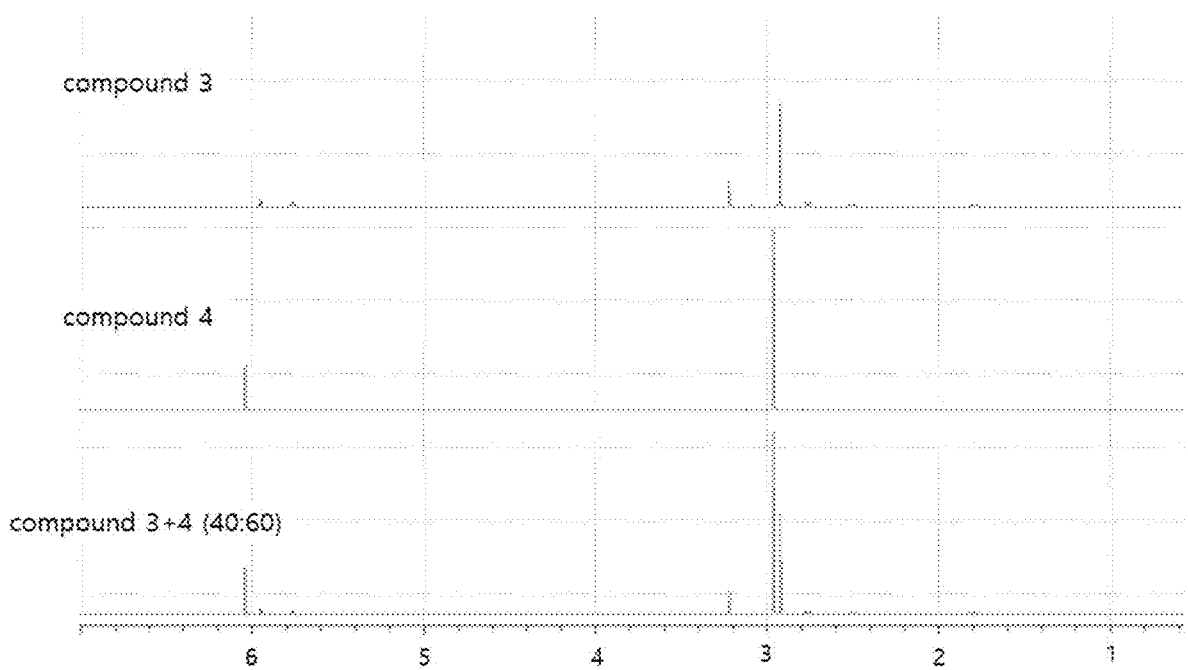
FIG. 4 shows the results of NMR analysis of Compound 3, Compound 4 and a composition including Compounds 3 and 4.
Figure 5:
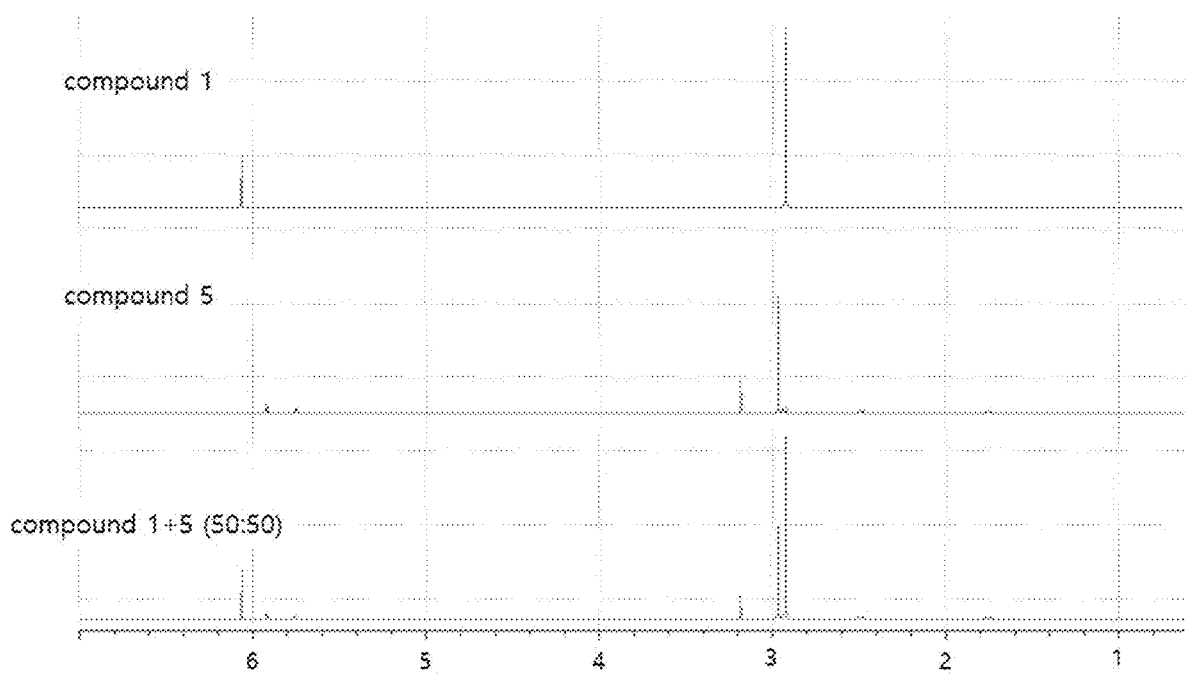
FIG. 5 shows the results of NMR analysis of Compound 1, Compound 5 and a composition including Compounds 1 and 5.
Figure 6:
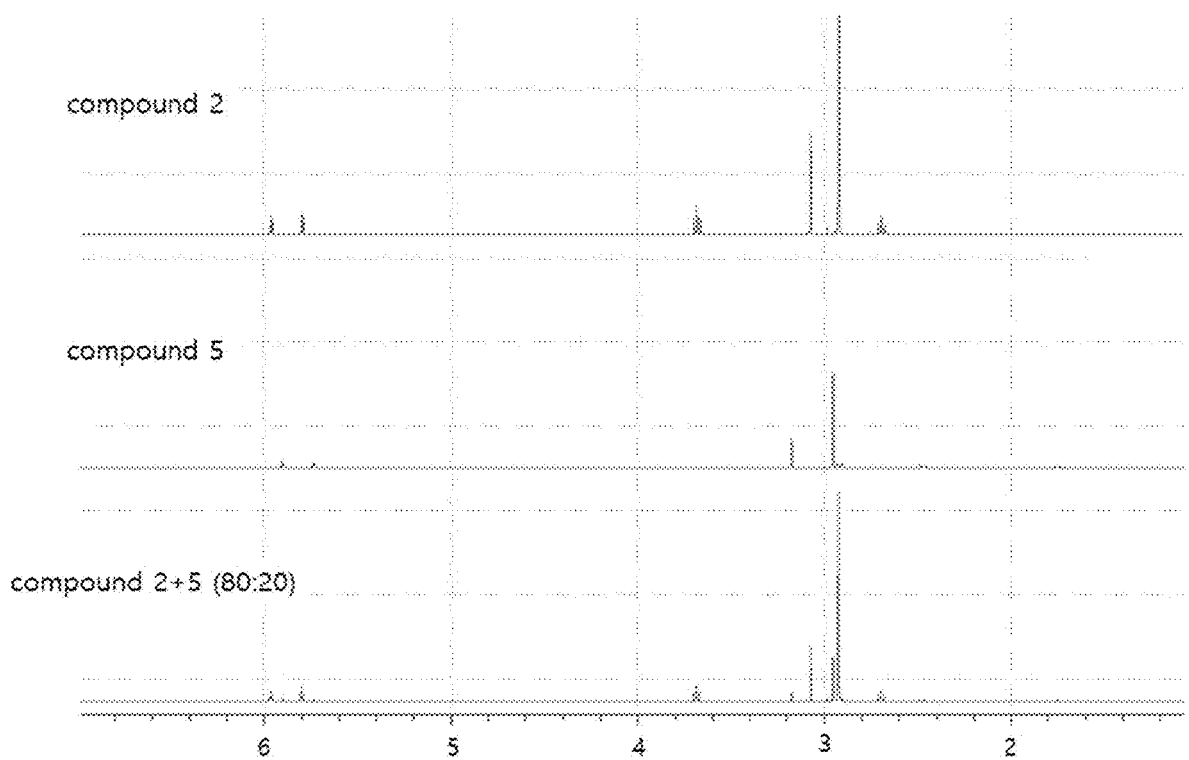
FIG. 6 shows the results of NMR analysis of Compound 2, Compound 5 and a composition including Compounds 2 and 5.

Hereinafter, a detailed description will be given of the present disclosure. The terms or words used in the description and the claims of the present disclosure are not to be construed limitedly as having typical or dictionary meanings, but should be interpreted as having meanings and concepts in keeping with the spirit of the present disclosure based on the principle that the inventors can appropriately define the terms in order to describe the present disclosure in the best way.

According to the present disclosure, a precursor composition for forming a metal film includes a zirconium compound represented by any one of Chemical Formula 1 to Chemical Formula 3 below and a hafnium compound represented by any one of Chemical Formula 4 to Chemical Formula 6 below.

[Chemical Formula 1]

[Chemical Formula 2]

[Chemical Formula 3]

[Chemical Formula 4]

[Chemical Formula 5]

[Chemical Formula 6]

(In Chemical Formulas 1 to 6, $R_1$ to $R_5$ are each independently a hydrogen atom or a $C_1$-$C_6$ alkyl group, L is a linker including Si or $C_1$-$C_3$, and each of $X_1$ to $X_3$ is a $C_1$-$C_8$ alkyl group, —$NR_6R_7$, —$OR_8$, or a cyclopentadienyl group with or without a substituent, in which $R_6$ to $R_8$ are each independently a $C_1$-$C_6$ alkyl group.)

The zirconium compound represented by Chemical Formula 1 is a compound containing one cyclopentadienyl group, and typical examples thereof may include, but are not limited to, the following materials.

Used may be at least one compound selected from among $CpZr(NMe_2)_3$, $[MeCp]Zr(NMe_2)_3$, $[(Me)_2Cp]Zr(NMe_2)_3$, $[(Me)_3Cp]Zr(NMe_2)_3$, $[(Me)_4Cp]Zr(NMe_2)_3$, $[(Me)_5Cp]Zr(NMe_2)_3$, $[EtCp]Zr(NMe_2)_3$, $[(Et)_2Cp]Zr(NMe_2)_3$, $[(Et)_3Cp]Zr(NMe_2)_3$, $[(Et)_4Cp]Zr(NMe_2)_3$, $[(Et)_5Cp]Zr(NMe_2)_3$, $[^nPrCp]Zr(NMe_2)_3$, $[(^nPr)_2Cp]Zr(NMe_2)_3$, $[(^nPr)_3Cp]Zr(NMe_2)_3$, $[(^nPr)_4Cp]Zr(NMe_2)_3$, $[(^nPr)_5Cp]Zr(NMe_2)_3$, $[^iPrCp]Zr(NMe_2)_3$, $[(^iPr)_2Cp]Zr(NMe_2)_3$, $[(^iPr)_3Cp]Zr(NMe_2)_3$, $[(^iPr)_4Cp]Zr(NMe_2)_3$, $[(^iPr)_5Cp]Zr(NMe_2)_3$, $[^nBuCp]Zr(NMe_2)_3$, $[(^nBu)_2Cp]Zr(NMe_2)_3$, $[(^nBu)_3Cp]Zr(NMe_2)_3$, $[(^nBu)_4Cp]Zr(NMe_2)_3$, $[(nBu)_5Cp]Zr(NMe_2)_3$, $[^tBuCp]Zr(NMe_2)_3$, $[(^tBu)_2Cp]Zr(NMe_2)_3$, $[(^tBu)_3Cp]Zr(NMe_2)_3$, $[(^tBu)_4Cp]Zr(NMe_2)_3$, $[(^tBu)_5Cp]Zr(NMe_2)_3$, $[(Me)(Et)Cp]Zr(NMe_2)_3$, $[(Me)(Et)_2Cp]Zr(NMe_2)_3$, $[(Me)(Et)_3Cp]Zr(NMe_2)_3$, $[(Me)(Et)_4Cp]Zr(NMe_2)_3$, $[(Me)_2(Et)Cp]Zr(NMe_2)_3$, $[(Me)_2(Et)_2Cp]Zr(NMe_2)_3$, $[(Me)_3(Et)Cp]Zr(NMe_2)_3$, $[(Me)_3(Et)_2Cp]Zr(NMe_2)_3$, $[(Me)(^nPr)Cp]Zr(NMe_2)_3$, $[(Me)(^nPr)_2Cp]Zr(NMe_2)_3$, $[(Me)(^nPr)_3Cp]Zr(NMe_2)_3$, $[(Me)(^nPr)_4Cp]Zr(NMe_2)_3$, $[(Me)_2(^nPr)Cp]Zr(NMe_2)_3$, $[(Me)_2(^nPr)_2Cp]Zr(NMe_2)_3$, $[(Me)_3(^nPr)Cp]Zr(NMe_2)_3$, $[(Me)_3(^nPr)_2Cp]Zr(NMe_2)_3$, $[(Me)(^iPr)Cp]Zr(NMe_2)_3$, $[(Me)(^iPr)_2Cp]Zr(NMe_2)_3$, $[(Me)(^iPr)_3Cp]Zr(NMe_2)_3$, $[(Me)(^iPr)_4Cp]Zr(NMe_2)_3$, $[(Me)_2(^iPr)Cp]Zr(NMe_2)_3$, $[(Me)_2(^iPr)_2Cp]Zr(NMe_2)_3$, $[(Me)_3(^iPr)Cp]Zr(NMe_2)_3$, $[(Me)_3(Pr)_2Cp]Zr(NMe_2)_3$, $[(Me)(^tBu)Cp]Zr(NMe_2)_3$, $[(Me)(^tBu)_2Cp]Zr(NMe_2)_3$, $[(Me)(^tBu)_3Cp]Zr(NMe_2)_3$, $[(Me)(^tBu)_4Cp]Zr(NMe_2)_3$, $[(Me)_2(^tBu)Cp]Zr(NMe_2)_3$, $[(Me)_2(^tBu)_2Cp]Zr(NMe_2)_3$, $[(Me)_3(Bu)Cp]Zr(NMe_2)_3$, and $[(Me)_3(^tBu)_2Cp]Zr(NMe_2)_3$.

In addition, the zirconium compound represented by Chemical Formula 2 is a compound containing two cyclopentadienyl groups, and typical examples thereof may include, but are not limited to, the following materials.

Used may be at least one compound selected from among $[Cp]_2Zr(NMe_2)_2$, $[MeCp]_2Zr(NMe_2)_2$, $[(Me)_2Cp]_2Zr(NMe_2)_2$, $[(Me)_3Cp]_2Zr(NMe_2)_2$, $[(Me)_4Cp]_2Zr(NMe_2)_2$, $[(Me)_5Cp]_2Zr(NMe_2)_2$, $[EtCp]_2Zr(NMe_2)_2$, $[(Et)_2Cp]_2Zr(NMe_2)_2$, $[(Et)_3Cp]_2Zr(NMe_2)_2$, $[(Et)_4Cp]_2Zr(NMe_2)_2$, $[(Et)_5 Cp]_2Zr(NMe_2)_2$, $[^nPrCp]_2Zr(NMe_2)_2$, $[(^nPr)_2Cp]_2Zr(NMe_2)_2$, $[(^nPr)_3Cp]_2Zr(NMe_2)_2$, $[(^nPr)_4Cp]_2Zr(NMe_2)_2$, $[(^nPr)_5Cp]_2Zr(NMe_2)_2$, $[^iPrCp]_2Zr(NMe_2)_2$, $[(^iPr)_2Cp]_2Zr(NMe_2)_2$, $[(^iPr)_3Cp]_2Zr(NMe_2)_2$, $[(^iPr)_4Cp]_2Zr(NMe_2)_2$, $[(^iPr)_5Cp]_2Zr(NMe_2)_2$, $[^nBuCp]_2Zr(NMe_2)_2$, $[(^nBu)_2Cp]_2Zr(NMe_2)_2$, $[(^nBu)_3Cp]_2Zr(NMe_2)_2$, $[(^nBu)_4Cp]_2Zr(NMe_2)_2$, $[(^nBu)_5Cp]_2Zr(NMe_2)_2$, $[^tBuCp]_2Zr(NMe_2)_2$, $[(^tBu)_2Cp]_2Zr(NMe_2)_2$, $[(^tBu)_3Cp]_2Zr(NMe_2)_2$, $[(^tBu)_4Cp]_2Zr(NMe_2)_2$, $[(Bu)_5Cp]_2Zr(NMe_2)_2$, $[(Me)(Et)Cp]_2Zr(NMe_2)_2$, $[(Me)(Et)_2 Cp]_2Zr(NMe_2)_2$, $[(Me)(Et)_3Cp]_2Zr(NMe_2)_2$, $[(Me)(Et)_4 Cp]_2Zr(NMe_2)_2$, $[(Me)_2(Et)Cp]_2Zr(NMe_2)_2$, $[(Me)_2(Et)_2Cp]_2Zr(NMe_2)_2$, $[(Me)_3(Et)Cp]_2Zr(NMe_2)_2$, $[(Me)_3(Et)_2Cp]_2Zr(NMe_2)_2$, $[(Me)(^nPr)Cp]_2Zr(NMe_2)_2$, $[(Me)(^nPr)_2Cp]_2Zr(NMe_2)_2$, $[(Me)(^nPr)_3Cp]_2Zr(NMe_2)_2$, $[(Me)(^nPr)_4Cp]_2Zr(NMe_2)_2$, $[(Me)_2(^nPr)Cp]_2Zr(NMe_2)_2$, $[(Me)_2(^nPr)_2Cp]_2Zr(NMe_2)_2$, $[(Me)_3(^nPr)Cp]_2Zr(NMe_2)_2$, $[(Me)_3(^nPr)_2Cp]_2Zr(NMe_2)_2$, $[(Me)(^iPr)Cp]_2Zr(NMe_2)_2$, $[(Me)(^iPr)_3Cp]_2Zr(NMe_2)_2$, $[(Me)(^iPr)_4Cp]_2Zr(NMe_2)_2$, $[(Me)_2(^iPr)Cp]_2Zr(NMe_2)_2$, $[(Me)_2(^iPr)_2Cp]_2Zr(NMe_2)_2$, $[(Me)_3(^iPr)Cp]_2Zr(NMe_2)_2$, $[(Me)_3(^iPr)_2Cp]_2Zr(NMe_2)_2$, $[(Me)(^tBu)Cp]_2Zr(NMe_2)_2$, $[(Me)(^tBu)_3Cp]_2Zr(NMe_2)_2$, $[(Me)(^tBu)_2Cp]_2Zr(NMe_2)_2$, $[(Me)

($^t$Bu)$_4$Cp]$_2$Zr(NMe$_2$)$_2$, [(Me)$_2$(Bu)Cp]$_2$Zr(NMe$_2$)$_2$, [(Me)$_2$($^t$Bu)$_2$Cp]$_2$Zr(NMe$_2$)$_2$, [(Me)$_3$(Bu)Cp]$_2$Zr(NMe$_2$)$_2$, and [(Me)$_3$($^t$Bu)$_2$Cp]$_2$Zr(NMe$_2$)$_2$.

In addition, the zirconium compound represented by Chemical Formula 3 is a compound configured such that a cyclopentadienyl group and a metal atom are bridged via a linker therebetween, and typical examples thereof may include, but are not limited to, the following materials.

Used may be at least one compound selected from among Zr[CpCH$_2$NMe](NMe$_2$)$_2$, Zr[Cp(CH$_2$)$_2$NMe](NMe$_2$)$_2$, Zr[Cp(CH$_2$)$_3$NMe](NMe$_2$)$_2$, Zr[Cp(CH$_2$)$_4$NMe](NMe$_2$)$_2$, Zr[Cp(CH$_2$)$_5$NMe](NMe$_2$)$_2$, Zr[CpCH$_2$NMe](Cp)(NMe$_2$), Zr[Cp(CH$_2$)$_2$NMe](Cp)(NMe$_2$), Zr[Cp(CH$_2$)$_3$NMe](Cp)(NMe$_2$), Zr[Cp(CH$_2$)$_4$NMe](Cp)(NMe$_2$), Zr[Cp(CH$_2$)$_5$NMe](Cp)(NMe$_2$), Zr[(CpMe)CH$_2$NMe](NMe$_2$)$_2$, Zr[(CpMe)(CH$_2$)$_2$NMe](NMe$_2$)$_2$, Zr[(CpMe)(CH$_2$)$_3$NMe](NMe$_2$)$_2$, Zr[(CpMe)(CH$_2$)$_4$NMe](NMe$_2$)$_2$, Zr[(CpMe)(CH$_2$)$_5$NMe](NMe$_2$)$_2$, Zr[(CpMe)CH$_2$NMe](Cp)(NMe$_2$), Zr[(CpMe)(CH$_2$)$_2$NMe](Cp)(NMe$_2$), Zr[(CpMe)(CH$_2$)$_3$NMe](Cp)(NMe$_2$), Zr[(CpMe)(CH$_2$)$_4$NMe](Cp)(NMe$_2$), Zr[(CpMe)(CH$_2$)$_5$NMe](Cp)(NMe$_2$), Zr[CpCH$_2$NMe](CpMe)(NMe$_2$), Zr[Cp(CH$_2$)$_2$NMe](CpMe)(NMe$_2$), Zr[Cp(CH$_2$)$_3$NMe](CpMe)(NMe$_2$), Zr[Cp(CH$_2$)$_4$NMe](CpMe)(NMe$_2$), Zr[Cp(CH$_2$)$_5$NMe](CpMe)(NMe$_2$), Zr[(CpMe$_2$)CH$_2$NMe](NMe$_2$)$_2$, Zr[(CpMe$_2$)(CH$_2$)$_2$NMe](NMe$_2$)$_2$, Zr[(CpMe$_2$)(CH$_2$)$_3$NMe](NMe$_2$)$_2$, Zr[(CpMe$_2$)(CH$_2$)$_4$NMe](NMe$_2$)$_2$, Zr[(CpMe$_2$)(CH$_2$)$_5$NMe](NMe$_2$)$_2$, Zr[(CpMe$_2$)CH$_2$NMe](Cp)(NMe$_2$), Zr[(CpMe$_2$)(CH$_2$)$_2$NMe](Cp)(NMe$_2$), Zr[(CpMe$_2$)(CH$_2$)$_3$NMe](Cp)(NMe$_2$), Zr[(CpMe$_2$)(CH$_2$)$_4$NMe](Cp)(NMe$_2$), Zr[(CpMe$_2$)(CH$_2$)$_5$NMe](Cp)(NMe$_2$), Zr[CpCH$_2$NMe](CpMe$_2$)(NMe$_2$), Zr[Cp(CH$_2$)$_2$NMe](CpMe$_2$)(NMe$_2$), Zr[Cp(CH$_2$)$_3$NMe](CpMe$_2$)(NMe$_2$), Zr[Cp(CH$_2$)$_4$NMe](CpMe$_2$)(NMe$_2$), Zr[Cp(CH$_2$)$_5$NMe](CpMe$_2$)(NMe$_2$), Zr[(CpMe$_3$)CH$_2$NMe](NMe$_2$)$_2$, Zr[(CpMe$_3$)(CH$_2$)$_2$NMe](NMe$_2$)$_2$, Zr[(CpMe$_3$)(CH$_2$)$_3$NMe](NMe$_2$)$_2$, Zr[(CpMe$_3$)(CH$_2$)$_4$NMe](NMe$_2$)$_2$, Zr[(CpMe$_3$)(CH$_2$)$_5$NMe](NMe$_2$)$_2$, Zr[(CpMe$_3$)CH$_2$NMe](Cp)(NMe$_2$), Zr[(CpMe$_3$)(CH$_2$)$_2$NMe](Cp)(NMe$_2$), Zr[(CpMe$_3$)(CH$_2$)$_3$NMe](Cp)(NMe$_2$), Zr[(CpMe$_3$)(CH$_2$)$_4$NMe](Cp)(NMe$_2$), Zr[(CpMe$_3$)(CH$_2$)$_5$NMe](Cp)(NMe$_2$), Zr[CpCH$_2$NMe](CpMe$_3$)(NMe$_2$), Zr[Cp(CH$_2$)$_3$NMe](CpMe$_3$)(NMe$_2$), Zr[Cp(CH$_2$)$_3$NMe](CpMe$_3$)(NMe$_2$), Zr[Cp(CH$_2$)$_4$NMe](CpMe$_3$)(NMe$_2$), Zr[Cp(CH$_2$)$_5$NMe](CpMe$_3$)(NMe$_2$), Zr[CpCH$_2$NMe](CpMe$_4$)(NMe$_2$), Zr[Cp(CH$_2$)$_3$NMe](CpMe$_4$)(NMe$_2$), Zr[Cp(CH$_2$)$_3$NMe](CpMe$_4$)(NMe$_2$), Zr[Cp(CH$_2$)$_4$NMe](CpMe$_4$)(NMe$_2$), Zr[Cp(CH$_2$)$_5$NMe](CpMe$_4$)(NMe$_2$) Zr[(CpEt)CH$_2$NMe](NMe$_2$)$_2$, Zr[(CpEt)(CH$_2$)$_2$NMe](NMe$_2$)$_2$, Zr[(CpEt)(CH$_2$)$_3$NMe](NMe$_2$)$_2$, Zr[(CpEt)(CH$_2$)$_4$NMe](NMe$_2$)$_2$, Zr[(CpEt)(CH$_2$)$_5$NMe](NMe$_2$)$_2$, Zr[CpCH$_2$NMe](CpEt)(NMe$_2$), Zr[Cp(CH$_2$)$_2$NMe](CpEt)(NMe$_2$), Zr[Cp(CH$_2$)$_3$NMe](CpEt)(NMe$_2$), Zr[Cp(CH$_2$)$_4$NMe](CpEt)(NMe$_2$), Zr[Cp(CH$_2$)$_5$NMe](CpEt)(NMe$_2$), Zr[(CpMeEt)CH$_2$NMe](NMe$_2$)$_2$, Zr[(CpMeEt)(CH$_2$)$_2$NMe](NMe$_2$)$_2$, Zr[(CpMeEt)(CH$_2$)$_3$NMe](NMe$_2$)$_2$, Zr[(CpMeEt)(CH$_2$)$_4$NMe](NMe$_2$)$_2$, Zr[(CpMeEt)(CH$_2$)$_5$NMe](NMe$_2$)$_2$, Zr[CpCH$_2$NMe](CpMeEt)(NMe$_2$), Zr[Cp(CH$_2$)$_2$NMe](CpMeEt)(NMe$_2$), Zr[Cp(CH$_2$)$_3$NMe](CpMeEt)(NMe$_2$), Zr[Cp(CH$_2$)$_4$NMe](CpMeEt)(NMe$_2$), Zr[Cp(CH$_2$)$_5$NMe](CpMeEt)(NMe$_2$), Zr[(CpMePr)CH$_2$NMe](NMe$_2$)$_2$, Zr[(CpMePr)(CH$_2$)$_2$NMe](NMe$_2$)$_2$, Zr[(CpMePr)(CH$_2$)$_3$NMe](NMe$_2$)$_2$, Zr[(CpMePr)(CH$_2$)$_4$NMe](NMe$_2$)$_2$, Zr[(CpMePr)(CH$_2$)$_5$NMe](NMe$_2$)$_2$, Zr[(Cp$^i$Pr)CH$_2$NMe](NMe$_2$)$_2$, Zr[(Cpi-PrEt)(CH$_2$)$_2$NMe](NMe$_2$)$_2$, Zr[(Cp$^i$PrEt)(CH$_2$)$_3$NMe](NMe$_2$)$_2$, Zr[(Cp$^i$PrEt)(CH$_2$)$_4$NMe](NMe$_2$)$_2$, and Zr[(Cp$^i$PrEt)(CH$_2$)$_5$NMe](NMe$_2$)$_2$.

In addition, the hafnium compound represented by Chemical Formula 4 is a compound containing one cyclopentadienyl group, and typical examples thereof may include, but are not limited to, the following materials.

Used may be at least one compound selected from among CpHf(NMe$_2$)$_3$, [MeCp]Hf(NMe$_2$)$_3$, [(Me)$_2$Cp]Hf(NMe$_2$)$_3$, [(Me)$_3$Cp]Hf(NMe$_2$)$_3$, [(Me)$_4$Cp]Hf(NMe$_2$)$_3$, [(Me)$_5$Cp]Hf(NMe$_2$)$_3$, [EtCp]Hf(NMe$_2$)$_3$, [(Et)$_2$Cp]Hf(NMe$_2$)$_3$, [(Et)$_3$Cp]Hf(NMe$_2$)$_3$, [(Et)$_4$Cp]Hf(NMe$_2$)$_3$, [(Et)$_5$Cp]Hf(NMe$_2$)$_3$, [$^n$PrCp]Hf(NMe$_2$)$_3$, [($^n$Pr)$_2$Cp]Hf(NMe$_2$)$_3$, [($^n$Pr)$_3$Cp]Hf(NMe$_2$)$_3$, [($^n$Pr)$_4$Cp]Hf(NMe$_2$)$_3$, [($^n$Pr)$_5$Cp]Hf(NMe$_2$)$_3$, [$^i$PrCp]Hf(NMe$_2$)$_3$, [($^i$Pr)$_2$Cp]Hf(NMe$_2$)$_3$, [($^i$Pr)$_3$Cp]Hf(NMe$_2$)$_3$, [($^i$Pr)$_4$Cp]Hf(NMe$_2$)$_3$, [($^i$Pr)$_5$Cp]Hf(NMe$_2$)$_3$, [$^n$BuCp]Hf(NMe$_2$)$_3$, [($^n$Bu)$_2$Cp]Hf(NMe$_2$)$_3$, [($^n$Bu)$_3$Cp]Hf(NMe$_2$)$_3$, [($^n$Bu)$_4$Cp]Hf(NMe$_2$)$_3$, [($^n$Bu)$_5$Cp]Hf(NMe$_2$)$_3$, [$^t$BuCp]Hf(NMe$_2$)$_3$, [($^t$Bu)$_2$Cp]Hf(NMe$_2$)$_3$, [($^t$Bu)$_3$Cp]Hf(NMe$_2$)$_3$, [($^t$Bu)$_4$Cp]Hf(NMe$_2$)$_3$, [($^t$Bu)$_5$Cp]Hf(NMe$_2$)$_3$, [(Me)(Et)Cp]Hf(NMe$_2$)$_3$, [(Me)(Et)$_2$Cp]Hf(NMe$_2$)$_3$, [(Me)(Et)$_3$Cp]Hf(NMe$_2$)$_3$, [(Me)(Et)$_4$Cp]Hf(NMe$_2$)$_3$, [(Me)$_2$(Et)Cp]Hf(NMe$_2$)$_3$, [(Me)$_2$(Et)$_2$Cp]Hf(NMe$_2$)$_3$, [(Me)$_3$(Et)Cp]Hf(NMe$_2$)$_3$, [(Me)$_3$(Et)$_2$Cp]Hf(NMe$_2$)$_3$, [(Me)($^n$Pr)Cp]Hf(NMe$_2$)$_3$, [(Me)($^n$Pr)$_2$Cp]Hf(NMe$_2$)$_3$, [(Me)($^n$Pr)$_3$Cp]Hf(NMe$_2$)$_3$, [(Me)($^n$Pr)$_4$Cp]Hf(NMe$_2$)$_3$, [(Me)$_2$($^n$Pr)Cp]Hf(NMe$_2$)$_3$, [(Me)$_2$($^n$Pr)$_2$Cp]Hf(NMe$_2$)$_3$, [(Me)$_3$($^n$Pr)Cp]Hf(NMe$_2$)$_3$, [(Me)$_3$($^n$Pr)$_2$Cp]Hf(NMe$_2$)$_3$, [(Me)($^i$Pr)Cp]Hf(NMe$_2$)$_3$, [(Me)($^i$Pr)$_2$Cp]Hf(NMe$_2$)$_3$, [(Me)($^i$Pr)$_3$Cp]Hf(NMe$_2$)$_3$, [(Me)($^i$Pr)$_4$Cp]Hf(NMe$_2$)$_3$, [(Me)$_2$($^i$Pr)Cp]Hf(NMe$_2$)$_3$, [(Me)$_2$($^i$Pr)$_2$Cp]Hf(NMe$_2$)$_3$, [(Me)$_3$($^i$Pr)Cp]Hf(NMe$_2$)$_3$, [(Me)$_3$($^i$Pr)$_2$Cp]Hf(NMe$_2$)$_3$, [(Me)($^t$Bu)Cp]Hf(NMe$_2$)$_3$, [(Me)($^t$Bu)$_2$Cp]Hf(NMe$_2$)$_3$, [(Me)($^t$Bu)$_3$Cp]Hf(NMe$_2$)$_3$, [(Me)($^t$Bu)$_4$Cp]Hf(NMe$_2$)$_3$, [(Me)$_2$($^t$Bu)Cp]Hf(NMe$_2$)$_3$, [(Me)$_2$($^t$Bu)$_2$Cp]Hf(NMe$_2$)$_3$, [(Me)$_3$(Bu)Cp]Hf(NMe$_2$)$_3$, and [(Me)$_3$($^t$Bu)$_2$Cp]Hf(NMe$_2$)$_3$.

In addition, the hafnium compound represented by Chemical Formula 5 is a compound containing two cyclopentadienyl groups, and typical examples thereof may include, but are not limited to, the following materials.

Used may be at least one compound selected from among [Cp]$_2$Hf(NMe$_2$)$_2$, [MeCp]$_2$Hf(NMe$_2$)$_2$, [(Me)$_2$Cp]$_2$Hf(NMe$_2$)$_2$, [(Me)$_3$Cp]$_2$Hf(NMe$_2$)$_2$, [(Me)$_4$Cp]$_2$Hf(NMe$_2$)$_2$, [(Me)$_5$Cp]$_2$Hf(NMe$_2$)$_2$, [EtCp]$_2$Hf(NMe$_2$)$_2$, [(Et)$_2$Cp]$_2$Hf(NMe$_2$)$_2$, [(Et)$_3$Cp]$_2$Hf(NMe$_2$)$_2$, [(Et)$_4$Cp]$_2$Hf(NMe$_2$)$_2$, [(Et)$_5$Cp]$_2$Hf(NMe$_2$)$_2$, [$^n$PrCp]$_2$Hf(NMe$_2$)$_2$, [($^n$Pr)$_2$Cp]$_2$Hf(NMe$_2$)$_2$, [($^n$Pr)$_3$Cp]$_2$Hf(NMe$_2$)$_2$, [($^n$Pr)$_4$Cp]$_2$Hf(NMe$_2$)$_2$, [($^n$Pr)$_5$Cp]$_2$Hf(NMe$_2$)$_2$, [$^i$PrCp]$_2$Hf(NMe$_2$)$_2$, [($^i$Pr)$_2$Cp]$_2$Hf(NMe$_2$)$_2$, [($^i$Pr)$_3$Cp]$_2$Hf(NMe$_2$)$_2$, [($^i$Pr)$_4$Cp]$_2$Hf(NMe$_2$)$_2$, [($^i$Pr)$_5$Cp]$_2$Hf(NMe$_2$)$_2$, [$^n$BuCp]$_2$Hf(NMe$_2$)$_2$, [($^n$Bu)$_2$Cp]$_2$Hf(NMe$_2$)$_2$, [($^n$Bu)$_3$Cp]$_2$Hf(NMe$_2$)$_2$, [($^n$Bu)$_4$Cp]$_2$Hf(NMe$_2$)$_2$, [($^n$Bu)$_5$Cp]$_2$Hf(NMe$_2$)$_2$, [$^t$BuCp]$_2$Hf(NMe$_2$)$_2$, [($^t$Bu)$_2$Cp]$_2$Hf(NMe$_2$)$_2$, [($^t$Bu)$_3$Cp]$_2$Hf(NMe$_2$)$_2$, [($^t$Bu)$_4$Cp]$_2$Hf(NMe$_2$)$_2$, [($^t$Bu)$_5$Cp]$_2$Hf(NMe$_2$)$_2$, [(Me)(Et)Cp]$_2$Hf(NMe$_2$)$_2$, [(Me)(Et)$_2$Cp]$_2$Hf(NMe$_2$)$_2$, [(Me)(Et)$_3$Cp]$_2$Hf(NMe$_2$)$_2$, [(Me)(Et)$_4$Cp]$_2$Hf(NMe$_2$)$_2$, [(Me)$_2$(Et)Cp]$_2$Hf(NMe$_2$)$_2$, [(Me)$_2$(Et)$_2$Cp]$_2$Hf(NMe$_2$)$_2$, [(Me)$_3$(Et)Cp]$_2$Hf(NMe$_2$)$_2$, [(Me)$_3$(Et)$_2$Cp]$_2$Hf(NMe$_2$)$_2$, [(Me)($^n$Pr)Cp]$_2$Hf(NMe$_2$)$_2$, [(Me)($^n$Pr)$_2$Cp]$_2$Hf(NMe$_2$)$_2$, [(Me)($^n$Pr)$_3$Cp]$_2$Hf(NMe$_2$)$_2$, [(Me)($^n$Pr)$_4$Cp]$_2$Hf(NMe$_2$)$_2$, [(Me)$_2$($^n$Pr)Cp]$_2$Hf(NMe$_2$)$_2$, [(Me)$_2$($^n$Pr)$_2$Cp]$_2$Hf(NMe$_2$)$_2$, [(Me)$_3$($^n$Pr)Cp]$_2$Hf(NMe$_2$)$_2$, [(Me)$_3$($^n$Pr)$_2$Cp]$_2$Hf(NMe$_2$)$_2$, [(Me)($^i$Pr)Cp]$_2$Hf(NMe$_2$)$_2$, [(Me)(Pr)$_2$Cp]$_2$Hf(NMe$_2$)$_2$, [(Me)($^i$Pr)$_3$Cp]$_2$Hf(NMe$_2$)$_2$, [(Me)($^i$Pr)$_4$Cp]$_2$Hf(NMe$_2$)$_2$, [(Me)$_2$($^i$Pr)Cp]$_2$Hf(NMe$_2$)$_2$, [(Me)$_2$($^i$Pr)$_2$Cp]$_2$Hf(NMe$_2$)$_2$, [(Me)$_3$($^i$Pr)Cp]$_2$Hf(NMe$_2$)$_2$, [(Me)$_3$($^i$Pr)$_2$Cp]$_2$Hf(NMe$_2$)$_2$, [(Me)($^t$Bu)Cp]$_2$Hf(NMe$_2$)$_2$, [(Me)($^t$Bu)$_2$Cp]$_2$Hf(NMe$_2$)$_2$, [(Me)($^t$Bu)$_3$Cp]$_2$Hf(NMe$_2$)$_2$, [(Me)($^t$Bu)$_4$Cp]$_2$Hf(NMe$_2$)$_2$, [(Me)$_2$($^t$Bu)Cp]$_2$Hf(NMe$_2$)$_2$, [(Me)$_2$($^t$Bu)$_2$Cp]$_2$Hf(NMe$_2$)$_2$, [(Me)$_3$(Bu)Cp]$_2$Hf(NMe$_2$)$_2$, and [(Me)$_3$($^t$Bu)$_2$Cp]$_2$Hf(NMe$_2$)$_2$.

In addition, the hafnium compound represented by Chemical Formula 6 is a compound configured such that a cyclopentadienyl group and a metal atom are bridged via a linker therebetween, and typical examples thereof may include, but are not limited to, the following materials.

Used may be at least one compound selected from among Hf[CpCH$_2$NMe](NMe$_2$)$_2$, Hf[Cp(CH$_2$)$_2$NMe](NMe$_2$)$_2$, Hf[Cp(CH$_2$)$_3$NMe](NMe$_2$)$_2$, Hf[Cp(CH$_2$)$_4$NMe](NMe$_2$)$_2$, Hf[Cp(CH$_2$)$_5$NMe](NMe$_2$)$_2$, Hf[CpCH$_2$NMe](Cp)(NMe$_2$), Hf[Cp(CH$_2$)$_2$NMe](Cp)(NMe$_2$), Hf[Cp(CH$_2$)$_3$NMe](Cp)(NMe$_2$), Hf[Cp(CH$_2$)$_4$NMe](Cp)(NMe$_2$), Hf[Cp(CH$_2$)$_5$NMe](Cp)(NMe$_2$), Hf[(CpMe)CH$_2$NMe](NMe$_2$)$_2$, Hf[(CpMe)(CH$_2$)$_2$NMe](NMe$_2$)$_2$, Hf[(CpMe)(CH$_2$)$_3$NMe](NMe$_2$)$_2$, Hf[(CpMe)(CH$_2$)$_4$NMe](NMe$_2$)$_2$, Hf[(CpMe)(CH$_2$)$_5$NMe](NMe$_2$)$_2$, Hf[(CpMe)CH$_2$NMe](Cp)(NMe$_2$), Hf[(CpMe)(CH$_2$)$_2$NMe](Cp)(NMe$_2$), Hf[(CpMe)(CH$_2$)$_3$NMe](Cp)(NMe$_2$), Hf[(CpMe)(CH$_2$)$_4$NMe](Cp)(NMe$_2$), Hf[(CpMe)(CH$_2$)$_5$NMe](Cp)(NMe$_2$), Hf[CpCH$_2$NMe](CpMe)(NMe$_2$), Hf[Cp(CH$_2$)$_2$NMe](CpMe)(NMe$_2$), Hf[Cp(CH$_2$)$_3$NMe](CpMe)(NMe$_2$), Hf[Cp(CH$_2$)$_4$NMe](CpMe)(NMe$_2$), Hf[Cp(CH$_2$)$_5$NMe](CpMe)(NMe$_2$), Hf[(CpMe$_2$)CH$_2$NMe](NMe$_2$)$_2$, Hf[(CpMe$_2$)(CH$_2$)$_2$NMe](NMe$_2$)$_2$, Hf[(CpMe$_2$)(CH$_2$)$_3$NMe](NMe$_2$)$_2$, Hf[(CpMe$_2$)(CH$_2$)$_4$NMe](NMe$_2$)$_2$, Hf[(CpMe$_2$)(CH$_2$)$_5$NMe](NMe$_2$)$_2$, Hf[(CpMe$_2$)CH$_2$NMe](Cp)(NMe$_2$), Hf[(CpMe$_2$)(CH$_2$)$_2$NMe](Cp)(NMe$_2$), Hf[(CpMe$_2$)(CH$_2$)$_3$NMe](Cp)(NMe$_2$), Hf[(CpMe$_2$)(CH$_2$)$_4$NMe](Cp)(NMe$_2$), Hf[(CpMe$_2$)(CH$_2$)$_5$NMe](Cp)(NMe$_2$), Hf[CpCH$_2$NMe](CpMe$_2$)(NMe$_2$), Hf[Cp(CH$_2$)$_2$NMe](CpMe$_2$)(NMe$_2$), Hf[Cp(CH$_2$)$_3$NMe](CpMe$_2$)(NMe$_2$), Hf[Cp(CH$_2$)$_4$NMe](CpMe$_2$)(NMe$_2$), Hf[Cp(CH$_2$)$_5$NMe](CpMe$_2$)(NMe$_2$), Hf[(CpMe$_3$)CH$_2$NMe](NMe$_2$)$_2$, Hf[(CpMe$_3$)(CH$_2$)$_2$NMe](NMe$_2$)$_2$, Hf[(CpMe$_3$)(CH$_2$)$_3$NMe](NMe$_2$)$_2$, Hf[(CpMe$_3$)(CH$_2$)$_4$NMe](NMe$_2$)$_2$, Hf[(CpMe$_3$)(CH$_2$)$_5$NMe](NMe$_2$)$_2$, Hf[(CpMe$_3$)CH$_2$NMe](Cp)(NMe$_2$), Hf[(CpMe$_3$)(CH$_2$)$_2$NMe](Cp)(NMe$_2$), Hf[(CpMe$_3$)(CH$_2$)$_3$NMe](Cp)(NMe$_2$), Hf[(CpMe$_3$)(CH$_2$)$_4$NMe](Cp)(NMe$_2$), Hf[(CpMe$_3$)(CH$_2$)$_5$NMe](Cp)(NMe$_2$), Hf[CpCH$_2$NMe](CpMe$_3$)(NMe$_2$), Hf[Cp(CH$_2$)$_3$NMe](CpMe$_3$)(NMe$_2$), Hf[Cp(CH$_2$)$_3$NMe](CpMe$_3$)(NMe$_2$), Hf[Cp(CH$_2$)$_4$NMe](CpMe$_3$)(NMe$_2$), Hf[Cp(CH$_2$)$_5$NMe](CpMe$_3$)(NMe$_2$), Hf[CpCH$_2$NMe](CpMe$_4$)(NMe$_2$), Hf[Cp(CH$_2$)$_3$NMe](CpMe$_4$)(NMe$_2$), Hf[Cp(CH$_2$)$_3$NMe](CpMe$_4$)(NMe$_2$), Hf[Cp(CH$_2$)$_4$NMe](CpMe$_4$)(NMe$_2$), Hf[Cp(CH$_2$)$_5$NMe](CpMe$_4$)(NMe$_2$) Hf[(CpEt)CH$_2$NMe](NMe$_2$)$_2$, Hf[(CpEt)(CH$_2$)$_2$NMe](NMe$_2$)$_2$, Hf[(CpEt)(CH$_2$)$_3$NMe](NMe$_2$)$_2$, Hf[(CpEt)(CH$_2$)$_4$NMe](NMe$_2$)$_2$, Hf[(CpEt)(CH$_2$)$_5$NMe](NMe$_2$)$_2$, Hf[CpCH$_2$NMe](CpEt)(NMe$_2$), Hf[Cp(CH$_2$)$_2$NMe](CpEt)(NMe$_2$), Hf[Cp(CH$_2$)$_3$NMe](CpEt)(NMe$_2$), Hf[Cp(CH$_2$)$_4$NMe](CpEt)(NMe$_2$), Hf[Cp(CH$_2$)$_5$NMe](CpEt)(NMe$_2$), Hf[(CpMeEt)CH$_2$NMe](NMe$_2$)$_2$, Hf[(CpMeEt)(CH$_2$)$_2$NMe](NMe$_2$)$_2$, Hf[(CpMeEt)(CH$_2$)$_3$NMe](NMe$_2$)$_2$, Hf[(CpMeEt)(CH$_2$)$_4$NMe](NMe$_2$)$_2$, Hf[(CpMeEt)(CH$_2$)$_5$NMe](NMe$_2$)$_2$, Hf[CpCH$_2$NMe](CpMeEt)(NMe$_2$), Hf[Cp(CH$_2$)$_2$NMe](CpMeEt)(NMe$_2$), Hf[Cp(CH$_2$)$_3$NMe](CpMeEt)(NMe$_2$), Hf[Cp(CH$_2$)$_4$NMe](CpMeEt)(NMe$_2$), Hf[Cp(CH$_2$)$_5$NMe](CpMeEt)(NMe$_2$), Hf[(CpMePr)CH$_2$NMe](NMe$_2$)$_2$, Hf[(CpMePr)(CH$_2$)$_2$NMe](NMe$_2$)$_2$, Hf[(CpMePr)(CH$_2$)$_3$NMe](NMe$_2$)$_2$, Hf[(CpMePr)(CH$_2$)$_4$NMe](NMe$_2$)$_2$, Hf[(CpMePr)(CH$_2$)$_5$NMe](NMe$_2$)$_2$, Hf[(Cp$^i$Pr)CH$_2$NMe](NMe$_2$)$_2$, Hf[(Cp$i$-PrEt)(CH$_2$)$_2$NMe](NMe$_2$)$_2$, Hf[(Cp$^i$PrEt)(CH$_2$)$_3$NMe](NMe$_2$)$_2$, Hf[(Cp$^i$PrEt)(CH$_2$)$_4$NMe](NMe$_2$)$_2$, and Hf[(Cp$^i$PrEt)(CH$_2$)$_5$NMe](NMe$_2$)$_2$.

However, in the compounds listed above, Cp is a cyclopentadienyl group, Me is a methyl group, Et is an ethyl group, Pr is a propyl group, $^n$Pr is a normal propyl group, $^i$Pr is an isopropyl group, $^n$Bu is a normal butyl group, and $^t$Bu is a t-butyl group.

The precursor composition may include a solvent that is added to reduce the viscosity of the compound or dissolve the compound by diluting the compound when it is in the state of a liquid having high viscosity or a solid at room temperature. Also, the solvent may be included in an amount of 0.1 to 99 wt %, preferably 0.1 to 50 wt %, and more preferably 1 to 20 wt %, based on the total weight of the precursor composition for forming a metal film.

In general, the zirconium compound and the hafnium compound each containing a cyclopentadienyl group have viscosity ranging from about 8.7 to 10 cps, and when these compounds are mixed, the resulting viscosity amounts to 9 to 10 cps, which generally satisfies the viscosity value of 10 cps or less, and preferably 5 to 9 cps, required for a thin-film formation process. However, compounds having viscosity of 10 cps or more may exist depending on the structure thereof, and a composition using the same may have excessively high viscosity. Therefore, taking into consideration the viscosity value of the composition, the solvent is mixed and used in an appropriate amount within the above range.

According to the present disclosure, a method of forming a metal film includes depositing a metal film on a substrate using the precursor composition described above.

As such, the precursor composition for forming a metal film may additionally include a solvent, and as described above, the solvent may be included in an amount of 0.1 to 99 wt % based on the total weight of the precursor composition for forming a metal film.

This is because, in the case in which any one of the zirconium compound and the hafnium compound or a combination thereof is in the state of a liquid having high viscosity or a solid at room temperature, the amount of the solvent may vary depending on the amount of the compound in the highly viscous liquid state or the solid state that is contained therein. In addition, the zirconium compound and the hafnium compound may be contained at a weight ratio of 0.1:99.9 to 99.9:0.1, preferably 1:80 to 80:1, and more preferably 30:70 to 70:30. Here, the above ratio is controlled depending on the electrical properties and the desired end use of the metal film.

Specifically, the method of manufacturing a metal film using the precursor composition may be carried out according to a typical method of manufacturing a metal film through deposition, with the exception that the precursor composition described above is used as a metal compound, and specifically, a process such as chemical vapor deposition (CVD), atomic layer deposition (ALD), evaporation, or the like may be performed. For example, when depositing a thin film of yttrium oxide or yttrium nitride, in the ALD process, a precursor and a reactive gas may be injected into a chamber at a deposition temperature of 250° C. to 400° C., and in the CVD or evaporation process, a precursor and a reactive gas may be simultaneously injected at the above temperature.

Specifically, a metal film may be formed by supplying the precursor composition onto a substrate for forming a metal film placed in a reactor (chamber) and supplying a reactive gas into the reactor, followed by any one treatment process selected from the group consisting of heat treatment, plasma treatment, and light irradiation. For the plasma treatment, RF plasma, DC plasma, remote plasma, or the like may be used.

First, the precursor composition according to the present disclosure is supplied onto a substrate for forming a metal film. Here, the substrate for forming a metal film may be used without particular limitation, so long as it is one that is used for semiconductor manufacturing and needs to be coated with a metal film due to technical processing. Specifically, a silicon (Si) substrate, a silica ($SiO_2$) substrate, a silicon nitride (SiN) substrate, a silicon oxynitride (SiON) substrate, a titanium nitride (TiN) substrate, a tantalum nitride (TaN) substrate, a tungsten (W) substrate, or a noble metal substrate, for example, a platinum (Pt) substrate, a palladium (Pd) substrate, a rhodium (Rh) substrate, or a gold (Au) substrate, may be used.

In the precursor composition transfer step of supplying the precursor composition for forming a metal film onto the substrate, the transfer process may include a volatilization transfer process of transferring a volatilized gas of an organic solvent for improving the properties of the precursor composition or the thin film into a chamber using vapor pressure, a direct liquid injection process of directly injecting a liquid precursor composition, or a liquid transfer process using a liquid delivery system (LDS) in which the precursor composition is dissolved in an organic solvent and transferred. The process of transferring the liquid precursor composition may be carried out by converting the liquid precursor composition into a gas phase via a vaporizer using a liquid delivery system (LDS) and then transferring the gas onto a substrate for forming a thin metal film.

In the liquid transfer process in which the precursor composition is dissolved in an organic solvent and transferred, a solvent may be additionally included, and may be utilized when it is difficult to sufficiently vaporize some or all of the compounds applied to the precursor composition in a vaporizer of a liquid-transfer type due to the high viscosity thereof.

Examples of the solvent may include tertiary amines or alkanes having a boiling point of 130° C. or less, or 30-130° C., a density of 0.6 g/cm³ at room temperature, that is, 25° C., and a vapor pressure of 70 mmHg. When the boiling point, density and vapor-pressure conditions are all satisfied, the effects of decreasing the viscosity of the composition for forming a film and improving the volatility thereof are improved, so the formation of a thin film having improved uniformity and step coverage is possible.

In addition to the above solvent, however, any one solvent or a mixture of two or more solvents selected from among a $C_1$-$C_{16}$ saturated or unsaturated hydrocarbon, ketone, ether, glyme, ester, tetrahydrofuran, and tertiary amine may be applied to the process using the precursor composition, so long as it is able to dissolve zirconium and hafnium compounds and to ensure viscosity and solubility suitable for the liquid transfer process.

In an embodiment of the present disclosure, when dimethylethylamine is included in an amount of 1 to 99 wt % based on the total weight of the precursor composition, the liquid transfer process may be applied. If the amount of the tertiary amine is less than 1 wt %, the effect of improving the physical properties of the thin film may be insignificant, whereas if the amount thereof exceeds 99 wt %, the deposition rate may be decreased due to the low concentration of the precursor, so productivity may decrease. Hence, the amount thereof preferably falls within the above range. More specifically, the precursor composition is preferably configured to include the precursor composition and the solvent at a weight ratio of 90:10 to 10:90. Outside the above range, if the amount of the tertiary amine relative to the precursor composition is too low or too high, there is a concern that the effects of improving the uniformity and step coverage of the thin film may be deteriorated.

By including a solvent exhibiting low viscosity and high volatility, among the examples of the solvent described above, the precursor composition may exhibit improved viscosity and volatility, increase the substrate adsorption efficiency and stability of the precursor during substrate formation, and shorten the processing time. In addition, since the precursor material is vaporized in the state of being diluted in the solvent and is transferred into the deposition chamber in a more uniform state, it may be evenly adsorbed to the substrate, resulting in improved uniformity and step coverage of the deposited thin film. In addition, the excess unshared electron pair in the tertiary amine increases the stability of the precursor material in the substrate adsorption process, thereby minimizing chemical vapor deposition (CVD) in the ALD process. Also, when a solvent such as a $C_1$-$C_{16}$ saturated or unsaturated hydrocarbon, ketone, ether, glyme, ester, tetrahydrofuran, or a combination thereof is applied in addition to the tertiary amine as described above, not only appropriate viscosity control for liquid transfer but also improvement in dispersibility and electrical properties may be realized.

The precursor composition according to the present disclosure contains the zirconium compound and the hafnium compound, and the resulting metal film is capable of greatly improving high-K properties compared to a typical zirconium oxide thin film. In addition, since the thin film is formed through liquid transfer, the dispersibility of zirconium and hafnium is very high, and the deposited thin film exhibits uniform and superior electrical properties, and may achieve an effect of lowering leakage current.

In addition, when the precursor composition is supplied, a second metal precursor, particularly a metal precursor containing at least one metal (M") selected from among silicon (Si), titanium (Ti), germanium (Ge), strontium (Sr), niobium (Nb), barium (Ba), hafnium (Hf), tantalum (Ta), and lanthanide atoms, may be further optionally supplied as necessary, in order to further improve electrical properties, that is, increase the capacitance or decrease leakage current, of the metal film that is ultimately formed. The second metal precursor may be an alkylamide-based compound or an alkoxy-based compound containing the metal described above. For example, when the metal is Si, examples of the second metal precursor may include $SiH(N(CH_3)_2)_3$, $Si(N(C_2H_5)_2)_4$, $Si(N(C_2H_5)(CH_3))_4$, $Si(N(CH_3)_2)_4$, $Si(OC_4H_9)_4$, $Si(OC_2H_5)_4$, $Si(OCH_3)_4$, $Si(OC(CH_3)_3)_4$, etc.

The second metal precursor may be supplied in the same manner as the process of supplying the precursor composition, and the second metal precursor may be supplied together with the precursor composition onto the substrate for forming a thin film, or may be sequentially supplied after completion of supply of the precursor composition.

It is preferable that the precursor composition described above, and optionally the second metal precursor, be maintained at a temperature of 50 to 250° C., and more preferably 100 to 200° C., before supply into the reaction chamber in order to come into contact with the substrate for forming a metal film.

Before supply of the reactive gas after supplying the precursor composition, purging with an inert gas such as argon (Ar), nitrogen ($N_2$), or helium (He) in the reactor may be performed in order to make it easier for the precursor composition and optionally the second metal precursor to move onto the substrate, impart the reactor with appropriate pressure for deposition, and discharge impurities from the chamber to the outside. Here, it is preferable that purging with the inert gas be performed such that the internal pressure of the reactor is 1 to 5 Torr.

After completion of supply of the metal precursors, a reactive gas is supplied into the reactor, and in the presence of the reactive gas, any one type of treatment process selected from the group consisting of heat treatment, plasma treatment, and light irradiation may be performed.

The reactive gas may include any one or a mixture thereof selected from among water vapor ($H_2O$), oxygen ($O_2$), ozone ($O_3$), hydrogen peroxide ($H_2O_2$), hydrogen ($H_2$), ammonia ($NH_3$), nitrogen monoxide (NO), nitrous oxide ($N_2O$), and nitrogen dioxide ($NO_2$), hydrazine ($N_2H_4$), and silane ($SiH_4$). When the process is carried out in the presence of an oxidizing gas such as water vapor, oxygen, ozone, etc., a metal oxide thin film may be formed, and when the process is carried out in the presence of a reducing gas such as hydrogen, ammonia, hydrazine, or silane, a thin film of metal alone or metal nitride may be formed.

In addition, the heat treatment, plasma treatment, or light irradiation treatment process is for providing thermal energy for deposition of a metal precursor, and may be performed according to a typical method. Preferably, in order to manufacture a thin metal film having a desired physical state and composition at a sufficient growth rate, the treatment process is performed such that the temperature of the substrate in the reactor is 100° C. to 1,000° C., and preferably 250° C. to 400° C.

In addition, during the treatment process, as described above, purging with an inert gas such as argon (Ar), nitrogen ($N_2$), or helium (He) in the reactor may be performed in order to make it easier for the reactive gas to move onto the substrate, impart the reactor with appropriate pressure for deposition, and discharge impurities or byproducts from the reactor to the outside.

As described above, the introduction of the metal precursor, the introduction of the reactive gas, and the introduction of the inert gas are set as one cycle. A metal-containing thin film may be formed by repeating one or more cycles.

Specifically, when an oxidizing gas is used as the reactive gas, the resulting metal-containing thin film that is produced may include a metal oxide of Chemical Formula 7 below:

$$(M_{1-a}M''_a)O_b \qquad \text{[Chemical Formula 7]}$$

In Chemical Formula 7, a is 0≤a<1, b is 0<b≤2, M is selected from the group consisting of Zr, Hf and Ti, and M'' is derived from a second metal precursor and is selected from among silicon (Si), titanium (Ti), germanium (Ge), strontium (Sr), niobium (Nb), barium (Ba), hafnium (Hf), tantalum (Ta), and lanthanide atoms.

In the method of manufacturing such a metal film, the use of the metal precursor having high thermal stability makes it possible to perform the deposition process at a higher temperature than in a conventional deposition process and to form a thin film including high-purity metal, metal oxide or metal nitride without contamination of particles or impurities such as carbon caused by thermal decomposition of the precursor. Therefore, the metal-containing thin film formed according to the manufacturing method of the present disclosure is useful as a high-dielectric material film in a semiconductor device, particularly DRAM, CMOS, etc., in a semiconductor memory device.

In addition, an aspect of the present disclosure provides a metal film formed using the method of forming the metal film described above and a semiconductor device including the thin film. Specifically, the semiconductor device may be a semiconductor device including a metal-insulator-metal (MIM) structure for a random access memory (RAM).

Moreover, the semiconductor device has the same configuration as a typical semiconductor device, with the exception that the metal-containing thin film according to the present disclosure is included in a material film requiring high dielectric properties, such as DRAM in the device.

Specifically, in a capacitor configured by sequentially stacking a lower electrode, a dielectric thin film, and an upper electrode, the lower electrode and the upper electrode may include a metal material, and the lower electrode may be provided in various forms, such as a flat plate, a cylinder, a pillar, etc. Here, a thin film formed using the precursor composition of the present disclosure may be applied as the dielectric thin film.

For example, the dielectric thin film may include zirconium oxide and hafnium oxide, and may also be formed by stacking or mixing thin films including at least two oxides selected from among zirconium oxide and hafnium oxide.

The crystallinity, dielectric properties, and leakage current properties of the dielectric thin film may be improved by depositing the dielectric thin film on the cylinder-shaped or pillar-shaped lower electrode using the method described above.

For example, the dielectric thin film may be provided in various forms, in which $Zr_xHf_yO_z$ thin films may be stacked on both sides of an $Al_xO_y$ thin film or a $Y_xO_y$ thin film, as shown in FIGS. 1(a) and (b), or in which the $Zr_xHf_yO_z$ thin film may be stacked on the thin-film stack of $Al_xO_y$, $ZrO_x$ and $HfO_x$, as shown in FIGS. 1(b) to (e).

In addition, a transistor may be manufactured by applying the thin film of the present disclosure. The transistor is formed on a substrate, and includes a gate-insulating layer, a gate electrode, a source region, and a drain region. The gate electrode may include a metal material, and the gate-insulating layer may include a metal oxide or metal nitride thin film deposited using the composition for forming a thin film. For example, the gate-insulating layer may include zirconium oxide and hafnium oxide. Moreover, the gate-insulating layer may be formed by stacking or mixing at least two oxide thin films selected from among zirconium oxide and hafnium oxide. More specifically, an $Hf_xO_y$ or $Zr_xHf_yO_z$ thin film may be applied as the gate-insulating layer.

Hereinafter, the effects of the present disclosure are described with reference to examples.

Compounds for the preparation of the composition are shown in Table 1 below.

TABLE 1

| No. | Structural formula | Molecular formula |
|---|---|---|
| Compound 1 |  | $CpZr(NMe_2)_3$ |
| Compound 2 |  | $(CpCH_2CH_2NMe)Zr(NMe_2)_2$ |

TABLE 1-continued

| No. | Structural formula | Molecular formula |
|---|---|---|
| Compound 3 | [structure] | $(CpCH_2CH_2CH_2NMe)Zr(NMe_2)_2$ |
| Compound 4 | [structure] | $CpHf(NMe_2)_3$ |
| Compound 5 | [structure] | $(CpCH_2CH_2CH_2NMe)Hf(NMe_2)_2$ |

<Confirmation of Reactivity and Physical Properties of Precursor and Each Mixture>

In order to confirm the reactivity between compounds, compounds were directly mixed, and visual changes, changes upon measurement with nuclear magnetic resonance (NMR), and reactivity thereof were evaluated, and thermogravimetric analysis was performed and physical properties such as viscosity and thermal stability thereof were confirmed, as necessary.

The results of evaluation on Compound 1, Compound 4 and compositions thereof are shown in Table 2 below. In Table 2, the composition ratio is the weight ratio of Compound 1 and Compound 4.

TABLE 2

| Sample (Composition ratio) | ① | ④ | ①+④ (65:35) | ①+④ (60:40) | ①+④ (55:45) | ①+④ (50:50) | ①+④ (40:60) |
|---|---|---|---|---|---|---|---|
| Visual change | — | — | Color change X Precipitation X | Color change X Precipitation X | Color change X Precipitation X | Color change X Precipitation X | Color change X Precipitation X |
| NMR change | — | — | No change | No change | No change | No change | No change |
| Reactivity | — | — | No reactivity | No reactivity | No reactivity | No reactivity | No reactivity |

As is apparent from the results of Table 2, the compositions including Compounds 1 and 4 exhibited no color change and no precipitation upon visual observation. In addition, no change in the chemical structure was observed, based on the results of NMR measurement (FIG. 2). Therefore, it was found that the compositions including Compounds 1 and 4 were capable of being used in a stable state.

In addition, based on the results of NMR measurement for Compounds 2 and 4, 3 and 4, 1 and 5, and 2 and 5, it was confirmed that there was no change in the chemical structure according to the preparation of the composition (FIGS. 3 to 6).

Next, Compound 3, Compound 5 and compositions thereof were evaluated, and the results thereof are shown in Table 3 below. In Table 3, the composition ratio is the weight ratio of Compound 3 and Compound 5.

TABLE 3

| Sample (Composition ratio) | ③ | ⑤ | ③+⑤ (80:20) | ③+⑤ (60:40) | ③+⑤ (50:50) | ③+⑤ (40:60) | ③+⑤ (20:80) | ③+⑤ (60:40) |
|---|---|---|---|---|---|---|---|---|
| Solvent | — | — | — | — | — | — | — | Octane 5 wt % |
| Visual change | — | — | Color change X Precipitation X | Color change X Precipitation X | Color change X Precipitation X | Color change X Precipitation X | Color change X Precipitation X | Color change X Precipitation X |
| NMR change | — | — | No change | No change | No change | No change | No change | No change |
| Reactivity | — | — | No reactivity | No reactivity | No reactivity | No reactivity | No reactivity | No reactivity |
| TGA ($T_{1/2}$ °C.) | 208° C. | 205° C. | 208° C. | 209° C. | 204° C. | 207° C. | 207° C. | 205° C. |

Figure 7:
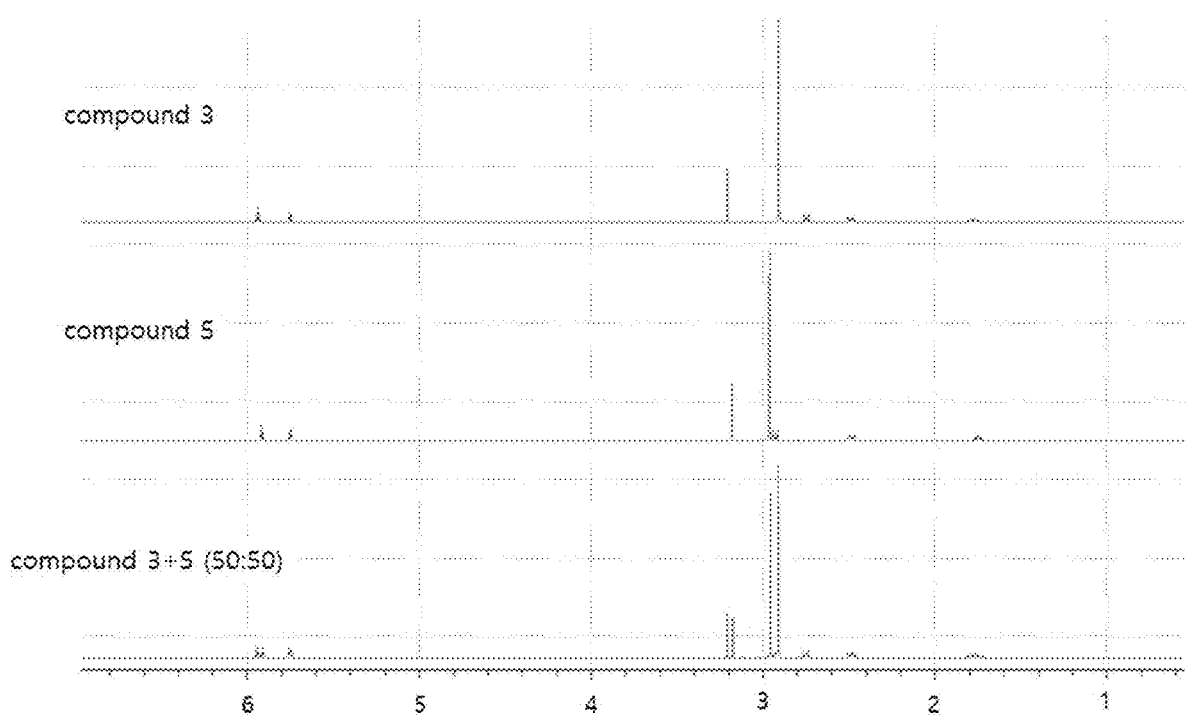
FIG. 7 shows the results of NMR analysis of Compound 3, Compound 5 and a composition including Compounds 3 and 5.
Figure 8A:
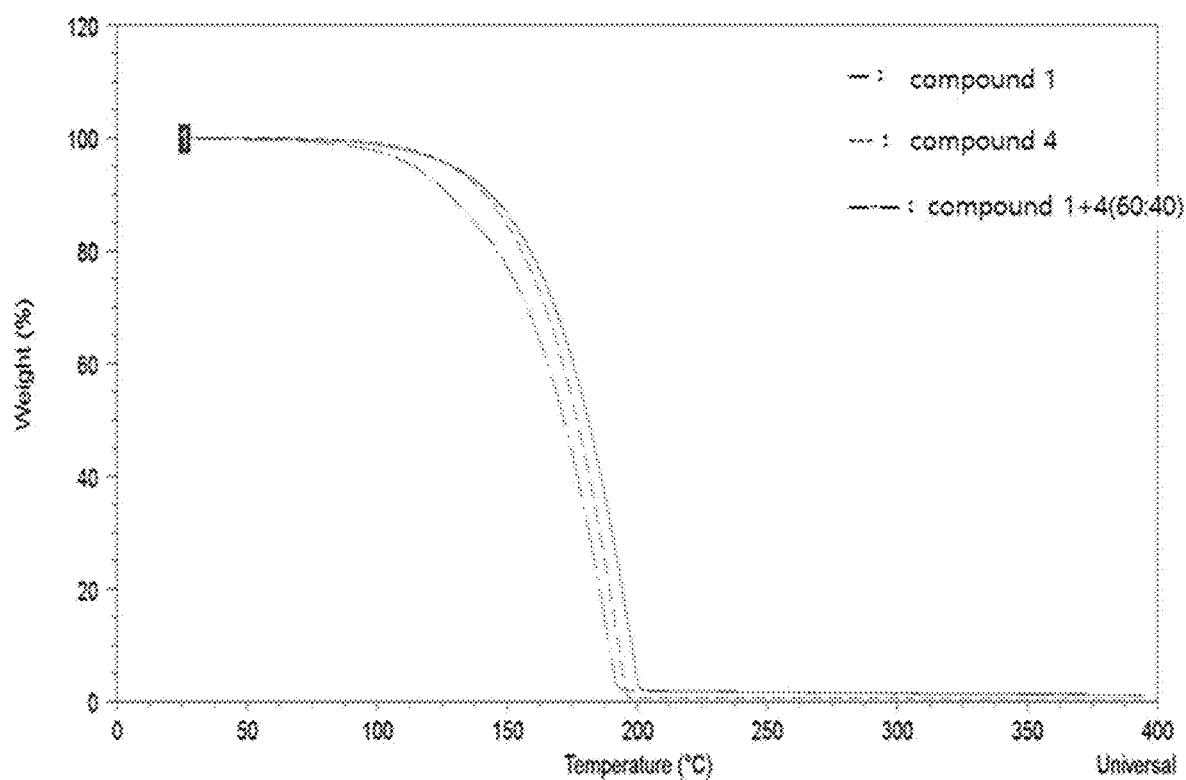
FIGS. 8A-8B show the results of thermogravimetric analysis of a zirconium precursor, a hafnium precursor and a zirconium/hafnium precursor composition according to Comparative Examples and Examples.
Figure 8B:
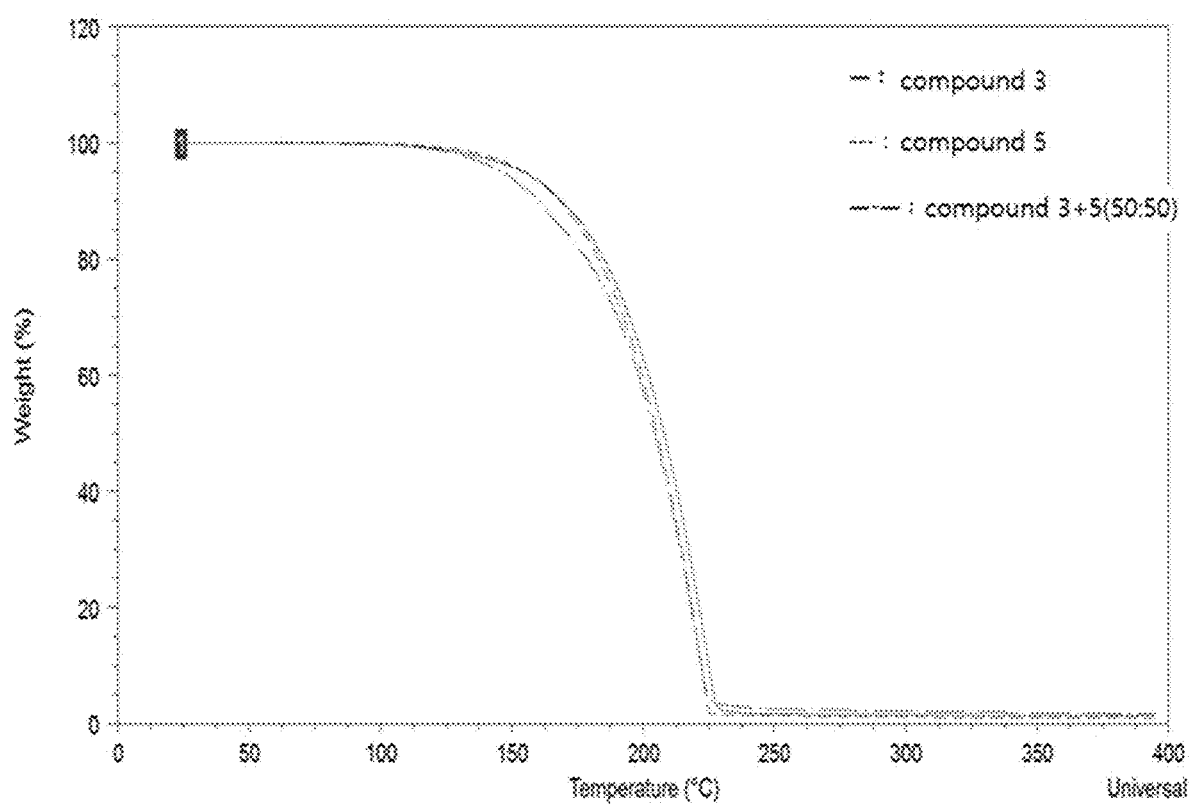

As is apparent from the results of Table 3, the compositions including Compounds 3 and 5 exhibited no color change and no precipitation upon visual observation. In addition, based on the results of NMR analysis, no change in the chemical structure was observed, indicating that the compositions including Compounds 3 and 5 were capable of being used in a stable state (FIG. 7). In addition, based on the results of TGA, even when these compounds were used in the form of a composition, there was no influence on volatilization properties, and the volatilization properties were maintained within the volatilization temperature range of each compound (FIG. 8A-8B).

Next, in order to evaluate physical properties depending on the amount of the solvent, octane and dimethylethylamine (DMEA) were used as solvents for a composition in which Compounds 1 and 4 were mixed at a weight ratio of 60:40. The results thereof are shown in Table 4 below.

TABLE 4

| Solvent (Amount-wt %) | — | Octane 0.5 | Octane 5 | DMEA 0.5 | DMEA 4 |
|---|---|---|---|---|---|
| NMR change | — | No change | No change | No change | No change |
| Viscosity (cPs) at 25° C. | 9.32 | 8.59 | 5.55 | 8.39 | 5.60 |
| TGA ($T_{1/2}$ ° C.) | 179° C. | 179° C. | 172° C. | 177° C. | 177° C. |

As is apparent from the results of Table 4, even when the composition was diluted with the solvent, no chemical change was observed, based on the results of NMR analysis. Therefore, it was possible to mix a suitable solvent as needed, and it was possible to control the viscosity of the composition to a level suitable for use in the deposition process by adjusting the amount of the solvent. In addition, based on the results of TGA, no significant change in volatilization properties appeared even when the solvent was added to the composition.

The results of analysis of the TGA and viscosity of Compound 1, Compound 4, and compositions thereof are shown in Table 5 below.

TABLE 5

| Sample (Composition ratio) | ① | ④ | ①+④ (65:35) | ①+④ (60:40) | ①+④ (55:45) | ①+④ (50:50) | ①+④ (40:60) |
|---|---|---|---|---|---|---|---|
| TGA ($T_{1/2}$° C.) | 181° C. | 177° C. | 177° C. | 178° C. | 177° C. | 171° C. | 174° C. |
| Viscosity (cPs) at 25° C. | 8.5 | 16.6 | 9.15 | 9.32 | 9.4 | 12.2 | 12.7 |

As is apparent from the results of Table 5, the compositions including Compounds 1 and 4 exhibited stable properties based on the results of TGA depending on the composition ratio. Specifically, even when these compounds were used in the form of a composition, there was no influence on volatilization properties, and the volatilization properties were exhibited within the volatilization temperature range of each compound. In addition, based on the results of measurement of viscosity, the viscosity was able to be controlled by adjusting the composition ratio. Moreover, there was no increase in viscosity as a side effect of mixing.

In addition, the thermal stability of Compound 1, Compound 4 and compositions thereof was analyzed, and the purity reduction rate relative to the initial purity in each sample was calculated. The results thereof are shown in Table 6 below.

TABLE 6

| Sample (Composition ratio) | ① | ④ | ①+④ (60/40) | ①+④ (65/35) | ①+④ (55/45) | ①+④ (50/50) | ①+④ (40/60) |
|---|---|---|---|---|---|---|---|
| Test start | 0 | 0 | 0 | 0 | 0 | 0 | 0 |
| 140° C./24 hr (Purity reduction rate) | 0.51 | 0.02 | 0.09 | 0.07 | 0.08 | 0.07 | 0.05 |
| 140° C./48 hr (Purity reduction rate) | 1.07 | 0.02 | 0.25 | 0.17 | 0.16 | 0.14 | 0.11 |
| 160° C./24 hr (Purity reduction rate) | 1.14 | 0.03 | 0.36 | 0.33 | 0.27 | 0.25 | 0.20 |
| 160° C./48 hr (Purity reduction rate) | 2.90 | 0.03 | 0.68 | 0.67 | 0.62 | 0.54 | 0.38 |

As is apparent from the results of Table 6, Compound 1 exhibited poor thermal stability compared to Compound 4. However, in the compositions including Compound 1 and Compound 4, there was a difference in the purity reduction rate depending on the composition ratio, but the purity reduction rate generally decreased. From these results, the effect of improving thermal stability was confirmed when compounds were applied in the form of a composition. Specifically, it was found that this effect appears because Compound 4, which has relatively high thermal stability, partially compensates for the effect of Compound 1, which has relatively low thermal stability, with regard to thermal energy.

In addition, in order to confirm the thermal stability depending on the type of solvent and composition, an evaluation was performed on a composition containing Compounds 1 and 4 at a weight ratio of 60:40. The results thereof are shown in Table 7 below.

TABLE 7

| Solvent (Amount-wt %) | — | Octane 0.5 | Octane 5 | DMEA 0.5 | DMEA 4 |
|---|---|---|---|---|---|
| 140° C./24 hr (Purity reduction rate) | 0.07 | 0.08 | 0.07 | 0.05 | 0.05 |
| 140° C./48 hr (Purity reduction rate) | 0.17 | 0.12 | 0.13 | 0.09 | 0.08 |
| 160° C./24 hr (Purity reduction rate) | 0.32 | 0.33 | 0.33 | 0.17 | 0.15 |
| 160° C./48 hr (Purity reduction rate) | 0.77 | 0.77 | 0.60 | 0.36 | 0.26 |

As is apparent from the results of Table 7, it was possible to confirm the purity reduction rate of the composition depending on the type and amount of the solvent compared to before the addition of the solvent at 140° C. and 160° C. In the case of octane, an improvement in the purity reduction rate depending on the amount of the solvent was not clearly apparent, but the stability was not deteriorated, and the solvent could be used for viscosity control and other purposes.

In addition, in the case of DEMA, the purity reduction rate was improved depending on the amount of the solvent. This is deemed to be due to the stabilization of the central metal of the precursor by the unshared electron pair of the amine in the amine solvent. Based on these test results, it was possible to control the physical properties of the composition by adding various solvents in order to optimize the composition and the deposition process of the composition.

In addition, the results of evaluation of the reactivity of each composition for Compounds 1 to 5 are shown in Table 8 below.

TABLE 8

| Sample (Composition ratio) | ①+④ (65/35) | ②+④ (60/40) | ③+④ (40/60) | ①+⑤ (50/50) | ②+⑤ (80/20) | ③+⑤ (60/40) |
|---|---|---|---|---|---|---|
| Visual change | — | — | Color change X Precipitation X | Color change X Precipitation X | Color change X Precipitation X | Color change X Precipitation X |
| NMR change | — | — | No change | No change | No change | No change |
| Reactivity | — | — | No reactivity | No reactivity | No reactivity | No reactivity |
| TGA ($T_{1/2}$° C.) | 177.51° C. | 182.38° C. | 189.11° C. | 189.11° C. | 197.98° C. | 209.01° C. |

As is apparent from the results of Table 8, none of the compositions exhibited any color change or precipitation upon visual observation. In addition, based on the results of NMR analysis, no change in the chemical structure was observed. Therefore, it was confirmed that the compositions including Compounds 1 to 5 in combination were capable of being used in a stable state. In addition, based on the results of TGA, even when these compounds were used in the form of a composition, there was no influence on volatilization properties, and the volatilization properties were maintained within the volatilization temperature range of each compound.

<Formation of Zirconium Oxide Thin Film, Hafnium Oxide Thin Film, and Zirconium/Hafnium Oxide Thin Film and Analysis of Thin-Film Properties>

An oxide thin-film deposition process was performed using a composition including Compounds 1 and 4 using an atomic layer deposition (ALD) device. The substrate used therefor was a bare Si wafer. A Zr oxide thin film was manufactured through a process using Compound 1 as a precursor (Comparative Example 1), and an Hf oxide thin film was manufactured through a process using Compound 2 as a precursor (Comparative Example 2).

In addition, a composition including Compounds 1 and 4 at a weight ratio of 60:40 (Example 1), a composition including Compounds 1 and 4 at a weight ratio of 50:50 (Example 2), a composition including Compounds 1 and 4 at a weight ratio of 40:60 (Example 3), and a composition including Compounds 1 and 4 at a weight ratio of 50:50 and 5 wt % of octane as a solvent (Example 4) were subjected to a deposition process.

In the ALD process for forming a thin film of each of Zr and Hf oxides, the source was introduced in a bubbling manner, and the deposition temperature was set to 300° C.

In addition, in the test on deposition of a Zr/Hf composite oxide thin film, the ALD process was performed in an LDS manner, and the deposition temperature was set to 300° C.

The growth per cycle (GPC) and uniformity of the Zr oxide thin film, Hf oxide thin film, and Zr/Hf composite oxide thin films manufactured though the ALD process were evaluated. The results thereof are shown in Table 9 below.

TABLE 9

| | Comparative Example 1 | Comparative Example 2 | Example 1 | Example 2 | Example 3 | Example 4 |
|---|---|---|---|---|---|---|
| Type of thin film | ZrO | HfO | Zr/HfO | Zr/HfO | Zr/HfO | Zr/HfO |
| GPC (Å/cycle) | 0.76 | 0.74 | 0.78 | 0.79 | 0.81 | 0.80 |

Figure 9:
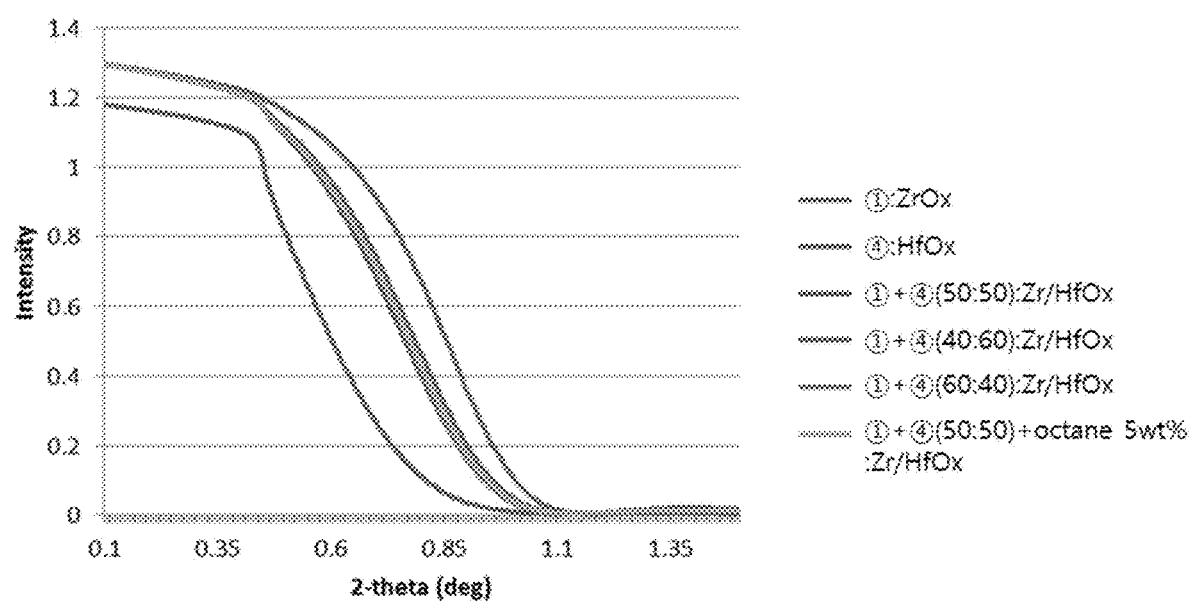
FIG. 9 shows the results of measurement of X-ray reflectivity of thin films deposited with a zirconium precursor, a hafnium precursor, and zirconium/hafnium precursor compositions according to Comparative Examples and Examples.

As is apparent from the results of Table 9, the compositions exhibited high GPC compared to the case of single-film deposition. This is deemed to be due to the promotion of seed formation and the increase in the surface reaction area in the deposition step because of the complementary effect of the two components constituting the composition in the deposition process. In addition, based on the results of confirming the X-ray reflectivity (XRR) of the manufactured Zr oxide thin film, Hf oxide thin film, and Zr/Hf oxide thin films, the film density is shown in Table 10 below and in FIG. 9.

TABLE 10

| | Comparative Example 1 | Comparative Example 2 | Example 1 | Example 2 | Example 3 | Example 4 |
|---|---|---|---|---|---|---|
| Type of thin film | ZrO | HfO | Zr/HfO | Zr/HfO | Zr/HfO | Zr/HfO |
| Film density (g/cm³) | 5.01 | 9.78 | 8.16 | 8.07 | 8.46 | 8.22 |

As is apparent from the results of Table 10, the deposition process using Compound 1 exhibited a significantly low film density compared to the deposition process using Compound 4. Moreover, in the deposition process using the compositions, the film density was high compared to when using the composition at the average composition ratio. From these results, it was confirmed that the thin film obtained in the deposition process using the composition exhibited a film density sufficient for manufacturing a semiconductor device.

Figure 10:
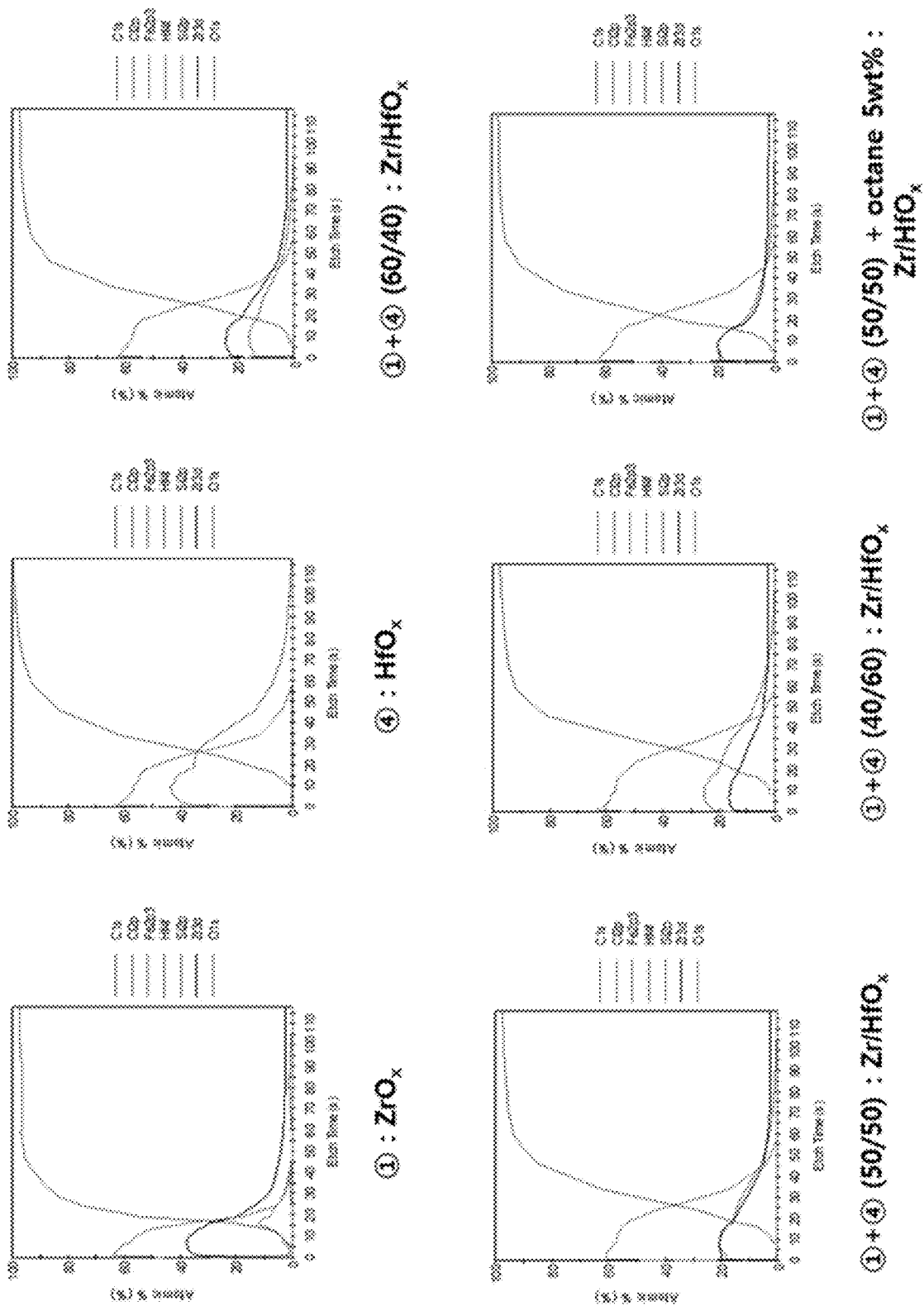
FIG. 10 shows the results of X-ray photoelectron spectroscopy of thin films deposited with a zirconium precursor, a hafnium precursor, and zirconium/hafnium precursor compositions according to Comparative Examples and Examples.

In addition, the results of X-ray photoelectron spectroscopy (XPS) of the Zr oxide thin film, Hf oxide thin film, and Zr/Hf oxide thin films manufactured through the thin-film formation process are shown in Table 11 below and in FIG. 10.

TABLE 11

|  | Zr (at %) | Hf (at %) | O (at %) | C (at %) | Cl (at %) |
| --- | --- | --- | --- | --- | --- |
| Comparative Example 1 | 37 | — | 62 | — | — |
| Comparative Example 2 | — | 41 | 59 | — | — |
| Example 1 | 23.8 | 15.2 | 60.8 | — | — |
| Example 2 | 20.2 | 19.4 | 60.2 | — | — |
| Example 3 | 16 | 24 | 59.8 | — | — |
| Example 4 | 19.8 | 19.3 | 60.7 | — | — |

As is apparent from the results of Table 11, in the deposition process using the Zr/Hf precursor compositions, the ratio of Zr and Hf in the composition and the content of Zr and Hf in the manufactured thin film were found to match. Therefore, this showed that the Zr/Hf concentration in the thin film was able to be easily controlled by adjusting the Zr/Hf ratio of the composition. In addition, all other impurities, such as C, Cl and the like, in the thin film amounted to 1 at % or less, indicating that it was possible to manufacture a pure thin film having no impurities in the ALD process.

Figure 11:
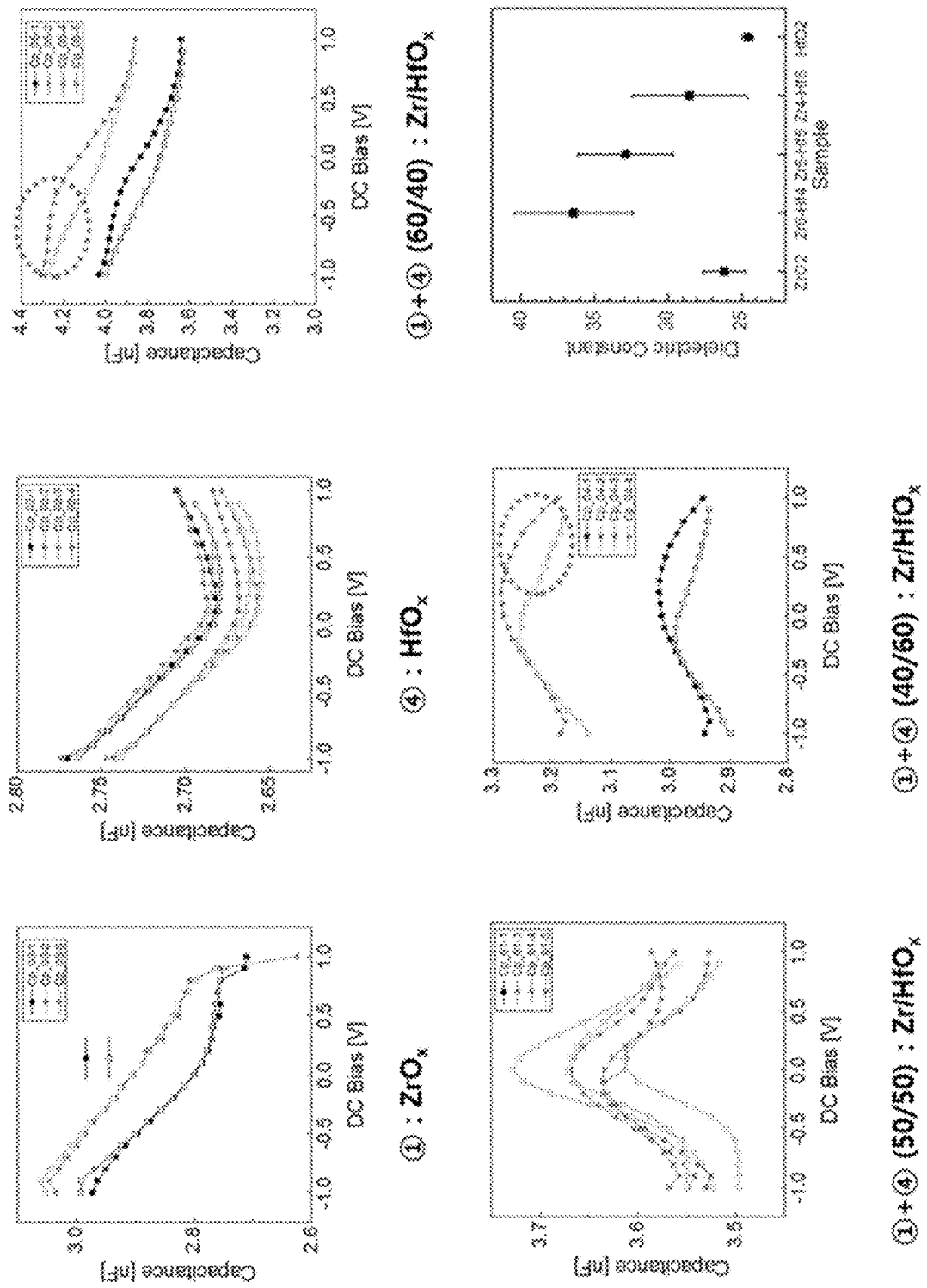
FIG. 11 shows the results of electrochemical cyclic voltammetry (CV) analysis of thin films deposited with a zirconium precursor, a hafnium precursor, and zirconium/hafnium precursor compositions according to Comparative Examples and Examples.

In addition, the results of electrochemical cyclic voltammetry (CV) of the manufactured Zr oxide thin film, Hf oxide thin film, and Zr/Hf oxide thin films are shown in Table 12 below and in FIG. 11.

TABLE 12

|  | Comparative Example 1 | Comparative Example 2 | Example 1 | Example 2 | Example 3 | Example 4 |
| --- | --- | --- | --- | --- | --- | --- |
| Type of thin film | ZrO | HfO | Zr/HfO | Zr/HfO | Zr/HfO | Zr/HfO |
| Dielectric constant (k) | 25.7-26.6 | 24.4-24.7 | 31.2-33.7 | 27.3-30.1 | 35.2-37.8 | Unmeasured |

As is apparent from Table 12, the Zr oxide thin film had a dielectric constant of about 26, and the Hf oxide thin film had a dielectric constant of about 25. For thin films obtained using the compositions, there was a difference in dielectric constant depending on the composition ratio, but a high dielectric constant of 30 or more was generally exhibited. In particular, when the composition ratio was 40:60 (Example 3), the dielectric constant was determined to be 35 or more. This showed that the overall dielectric constant of the thin film was capable of being effectively improved by controlling the composition ratio of Zr and Hf in the thin film using the composition.

Although the preferred embodiments of the present disclosure have been disclosed for illustrative purposes, those skilled in the art will appreciate that various modifications and alterations are possible, without departing from the spirit of the present disclosure. It is also to be understood that such modifications and alterations are incorporated in the scope of the present disclosure and the accompanying claims.

The invention claimed is:

1. A precursor composition for forming a metal film, comprising a zirconium compound represented by any one of Chemical Formula 1 to Chemical Formula 3 below and a hafnium compound represented by any one of Chemical Formula 4 to Chemical Formula 6 below:

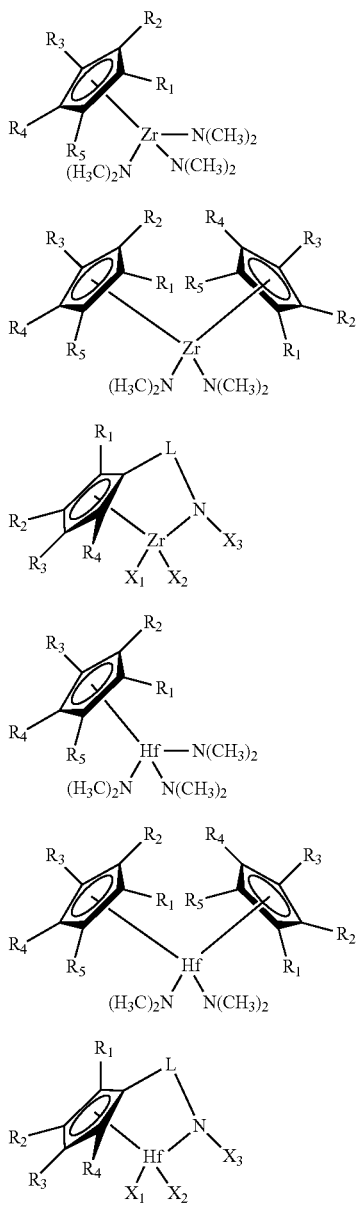

Chemical Formula 1
Chemical Formula 2
Chemical Formula 3
Chemical Formula 4
Chemical Formula 5
Chemical Formula 6 in Chemical Formulas 1 to 6, $R_1$ to $R_5$ are each independently a hydrogen atom or a $C_1$-$C_6$ alkyl group, L is a linker comprising Si or $C_1$-$C_3$, and each of $X_1$ to $X_3$ is a $C_1$-$C_5$ alkyl group, —$NR_6R_7$, —$OR_8$, or a cyclopentadienyl group with or without a substituent, in which $R_6$ to $R_8$ are each independently a $C_1$-$C_6$ alkyl group.

2. The precursor composition of claim 1, further comprising a solvent.

3. The precursor composition of claim 2, wherein the solvent is at least one selected from a $C_1$-$C_{16}$ saturated or unsaturated hydrocarbon, ketone, ether, glyme, ester, tetrahydrofuran, or tertiary amine.

4. The precursor composition of claim 2, wherein an amount of the solvent is 0.1 to 99 wt % based on a total weight of the precursor composition.

5. The precursor composition of claim 1, wherein the zirconium compound and the hafnium compound are mixed at a weight ratio of 0.1:99.9 to 99.9:0.1.

6. A method of forming a metal film, comprising depositing the precursor composition of claim 1 on a substrate.

7. The method of claim 6, wherein the precursor composition further comprises a solvent.

8. The method of claim 6, wherein an amount of the solvent is 0.1 to 99 wt % based on a total weight of the precursor composition.

9. The method of claim 6, wherein the metal film is deposited through any one process selected from atomic layer deposition, chemical vapor deposition, or evaporation.

10. The method of claim 6, further comprising a precursor composition transfer step of supplying the precursor composition onto the substrate, wherein the precursor composition transfer step is performed through any one process selected from a volatilization transfer process with a vapor pressure, a direct liquid injection process, or a liquid transfer process with a liquid delivery system.

11. The method of claim 6, wherein the depositing comprises:
placing the substrate in a chamber; supplying the precursor composition into the chamber; supplying a reactive gas or a plasma of a reactive gas into the chamber; and performing at least one selected from heat treatment, plasma treatment, or light irradiation in the chamber.

12. The method of claim 11, wherein the reactive gas is at least one selected from water vapor ($H_2O$), oxygen ($O_2$), ozone ($O_3$), hydrogen peroxide ($H_2O_2$), hydrogen ($H_2$), ammonia ($NH_3$), nitrogen monoxide (NO), nitrous oxide ($N_2O$), nitrogen dioxide ($NO_2$), hydrazine ($N_2H_4$), or silane ($SiH_4$), and the plasma of the reactive gas is any one selected from RF plasma, DC plasma, or remote plasma.

13. The method of claim 11, wherein a deposition temperature in the chamber is 250° C. to 400° C.

14. The method of claim 6, wherein the zirconium compound and the hafnium compound are mixed at a weight ratio of 0.1:99.9 to 99.9:0.1.

15. A semiconductor device comprising a metal film manufactured according to the method of claim 6.

16. A transistor comprising a metal film manufactured according to the method of claim 6, wherein the metal film constitutes a gate-insulating layer of the transistor.

17. The method of claim 7, wherein the metal film is deposited through any one process selected from atomic layer deposition, chemical vapor deposition, or evaporation.

18. The method of claim 7, further comprising a precursor composition transfer step of supplying the precursor composition onto the substrate,
wherein the precursor composition transfer step is performed through any one process selected from a volatilization transfer process in the presence of a vapor pressure, a direct liquid injection process, and a liquid transfer process using with a liquid delivery system.

19. The method of claim 7, wherein the depositing comprises:
placing the substrate in a chamber;
supplying the precursor composition into the chamber;
supplying a reactive gas or a plasma of a reactive gas into the chamber; and
performing at least one selected from heat treatment, plasma treatment, or light irradiation in the chamber.

20. The method of claim 19, wherein the reactive gas is at least one selected from water vapor ($H_2O$), oxygen ($O_2$), ozone ($O_3$), hydrogen peroxide ($H_2O_2$), hydrogen ($H_2$), ammonia ($NH_3$), nitrogen monoxide (NO), nitrous oxide ($N_2O$), nitrogen dioxide ($NO_2$), hydrazine ($N_2H_4$), or silane ($SiH_4$), and the plasma of the reactive gas is any one selected from RF plasma, DC plasma, or remote plasma.

21. The method of claim 19, wherein a deposition temperature in the chamber is 250° C. to 400° C.

22. The method of claim 7, wherein the zirconium compound and the hafnium compound are mixed at a weight ratio of 0.1:99.9 to 99.9:0.1.

23. A semiconductor device comprising a metal film manufactured according to the method of claim 7.

24. A transistor comprising a metal film manufactured using according to the method of claim 7, wherein the metal film constitutes a gate-insulating layer of the transistor.

* * * * *